United States Patent
Kim et al.

(10) Patent No.: US 11,296,029 B2
(45) Date of Patent: Apr. 5, 2022

(54) SEMICONDUCTOR DEVICE AND METHOD OF FABRICATING SAME

(71) Applicant: SAMSUNG ELECTRONICS CO., LTD., Suwon-si (KR)

(72) Inventors: Ju Youn Kim, Suwon-si (KR); Deok Han Bae, Hwaseong-si (KR); Jin-Wook Kim, Hwaseong-si (KR); Ju Hun Park, Seoul (KR); Myung Yoon Um, Seoul (KR); In Yeal Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/007,265

(22) Filed: Aug. 31, 2020

(65) Prior Publication Data

US 2021/0233847 A1    Jul. 29, 2021

(30) Foreign Application Priority Data

Jan. 28, 2020    (KR) .......................... 10-2020-0009800

(51) Int. Cl.
| | |
|---|---|
| *H01L 23/535* | (2006.01) |
| *H01L 29/06* | (2006.01) |
| *H01L 29/423* | (2006.01) |
| *H01L 29/417* | (2006.01) |
| *H01L 29/786* | (2006.01) |
| *H01L 29/08* | (2006.01) |
| *H01L 29/78* | (2006.01) |

(Continued)

(52) U.S. Cl.
CPC ...... *H01L 23/535* (2013.01); *H01L 21/32133* (2013.01); *H01L 21/32139* (2013.01); *H01L 21/76805* (2013.01); *H01L 21/76843* (2013.01); *H01L 21/76895* (2013.01); *H01L 29/0673* (2013.01); *H01L 29/0847* (2013.01); *H01L 29/41733* (2013.01); *H01L 29/41791* (2013.01); *H01L 29/42392* (2013.01); *H01L 29/7851* (2013.01); *H01L 29/78618* (2013.01); *H01L 29/78696* (2013.01)

(58) Field of Classification Search
CPC ............. H01L 23/535; H01L 21/32133; H01L 21/32139; H01L 21/76805; H01L 21/71843; H01L 21/76895; H01L 29/0673; H01L 29/0847; H01L 29/41733; H01L 29/41791; H01L 29/42392; H01L 29/7851; H01L 29/78618; H01L 29/78696
USPC ....................................................... 257/347
See application file for complete search history.

(56) References Cited

U.S. PATENT DOCUMENTS 9,324,709 B2    4/2016 Basker et al.
9,691,897 B2    6/2017 Xie et al.
(Continued)

*Primary Examiner* — Tong-Ho Kim
(74) *Attorney, Agent, or Firm* — Volentine, Whitt & Francos, PLLC

(57) ABSTRACT

A semiconductor device includes an active pattern extending in a first horizontal direction on a substrate, a gate electrode extending in a second horizontal direction across the active pattern, and including a first portion, and a second portion protruding upward from the first portion in a vertical direction, a capping pattern extending in the second horizontal direction on the gate electrode, and a gate contact disposed on the second portion of the gate electrode, overlapping the active pattern, and penetrating the capping pattern to connect the gate electrode.

16 Claims, 21 Drawing Sheets

(51) Int. Cl.
    *H01L 21/3213*    (2006.01)
    *H01L 21/768*     (2006.01)

(56) References Cited

U.S. PATENT DOCUMENTS

| | | |
|---|---|---|
| 10,121,874 B2 | 11/2018 | Zhang |
| 10,204,994 B2 | 2/2019 | Xie et al. |
| 10,347,744 B1 | 7/2019 | Cheng et al. |
| 10,388,747 B1 | 8/2019 | Xie et al. |
| 2019/0181042 A1* | 6/2019 | Xie .................. H01L 21/76819 |

* cited by examiner

SEMICONDUCTOR DEVICE AND METHOD OF FABRICATING SAME

This application claims the benefit of Korean Patent Application No. 10-2020-0009800 filed on Jan. 28, 2020 in the Korean Intellectual Property Office, the subject matter of which is hereby incorporated by reference.

BACKGROUND

1. Technical Field

The inventive concept relates generally to semiconductor devices.

2. Description of the Related Art

With rapid spread of information media, the performance, functional and physical demands placed upon contemporary semiconductor devices have increased. Low cost, high reliability and high device integration are ready examples of such demands And despite increasing demands for smaller pitch sizes and denser integration, semiconductors must also exhibit reduced parasitic capacitance and greater electrical stability between contacts.

SUMMARY

Embodiments of the inventive concept provide semiconductor devices providing improved reliability due, in part, to a gate electrode being directly connected to a gate contact on an active region using a vertical protrusion, thereby securing improved margin between the gate contact and a source/drain contact.

However, aspects of the inventive concept are not restricted to the one set forth herein. The above and other aspects of the inventive concept will become more apparent to one of ordinary skill in the art to which the inventive concept pertains by referencing the detailed explanation of the inventive concept given below.

According to embodiments of the inventive concept, there is provided a semiconductor device, a semiconductor device including; an active pattern extending in a first horizontal direction on a substrate, a gate electrode extends in a second horizontal direction across the active pattern, and includes a first portion, and a second portion protruding upward from the first portion in a vertical direction, a capping pattern extending in the second horizontal direction on the gate electrode, and a gate contact disposed on the vertical protrusion, overlaying the active pattern, and penetrating the capping pattern to connect to the gate electrode.

According to embodiments of the inventive concept, there is provided a semiconductor device including; an active pattern extending in a first horizontal direction on a substrate, a gate electrode extending in a second horizontal direction across the active pattern, and including a first portion, and a second portion protruding upward from the first portion in a vertical direction, a capping pattern extending in the second direction on the gate electrode, a source/drain region disposed on at least one side of the gate electrode, a gate contact penetrating through the capping pattern to connect the gate electrode, and a source/drain contact including a first portion connected to the source/drain region and extending in the second horizontal direction, and a second portion protruding upward from the first portion in the vertical direction, wherein an upper surface of the first portion of the source/drain contact being formed to be lower than an upper surface of the first portion of the gate electrode.

According to embodiments of the inventive concept, there is provided a semiconductor device including; a plurality of nanowires sequentially stacked on a substrate, wherein each nanowire in the plurality of nanowires extends in a first horizontal direction, a gate electrode surrounding the plurality of nanowires, extending in a second horizontal direction, and including a first portion, and a second portion protruding upward from the first portion in a vertical direction, a capping pattern extending in the second horizontal direction on the gate electrode, and a gate contact disposed on the second portion of the gate electrode, overlaying the plurality of nanowires, and penetrating the capping pattern to connect to the gate electrode.

According to embodiments of the inventive concept, there is provided a method of fabricating a semiconductor device, the method including; sequentially forming an active pattern, a field insulating film and a gate insulating film on a substrate including an active region, forming a pre-gate electrode film on the gate insulating film, forming a first mask pattern on the pre-gate electrode film, forming a first recess by etching the pre-gate electrode film using the first mask pattern as a mask, wherein the forming of the first recess provides a gate electrode including a first portion and a second portion, wherein the second portion protrudes upward from the first portion and is disposed on the first active region, forming a capping pattern on the gate electrode, and forming a first interlayer insulating film on the capping pattern, forming a second mask pattern on the first interlayer insulating film to overlay the second portion of the gate electrode, and forming a second recess over the second portion by etching the first interlayer insulating film and the capping pattern using the second mask pattern as a mask, and forming a gate contact in the second recess.

BRIEF DESCRIPTION OF THE DRAWINGS

The above and other aspects and features of the inventive concept will become more apparent by describing in detail exemplary embodiments thereof with reference to the attached drawings, in which.

DETAILED DESCRIPTION

Throughout the written description certain geometric terms may be used to highlight certain relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; closer/farther; thicker/thinner; proximate/distant; above/below; under/over; upper/lower; uppermost/lowermost; center/edge; surround; periphery; overlay/underlay; beside; parallel, etc.

The accompanying drawings illustrate a fin-type transistor (or FinFET) including a channel region having a fin-type pattern shape, and a transistor including a nanowire or a nanosheet according to certain embodiments of the inventive concept. However, the illustrated embodiments are merely selected examples of a broad class of semiconductor devices that include one or more aspects of the inventive concept, and the scope of the inventive concept is not limited thereto. Other semiconductor devices that may incorporate or are susceptible to benefits of the inventive concept include, for example, tunneling transistors (e.g., a tunneling FET), planar transistors, three-dimensional (3D) transistors, bipolar junction transistors, laterally diffused metal oxide semiconductors (LDMOS), etc.

Hereinafter, a semiconductor device according to embodiments of the inventive concept disclosure will be described in some additional detail with reference to FIGS. 1, 2, 3, 4 and 5 (collectively, "FIGS. 1 to 5").

Figure 1:
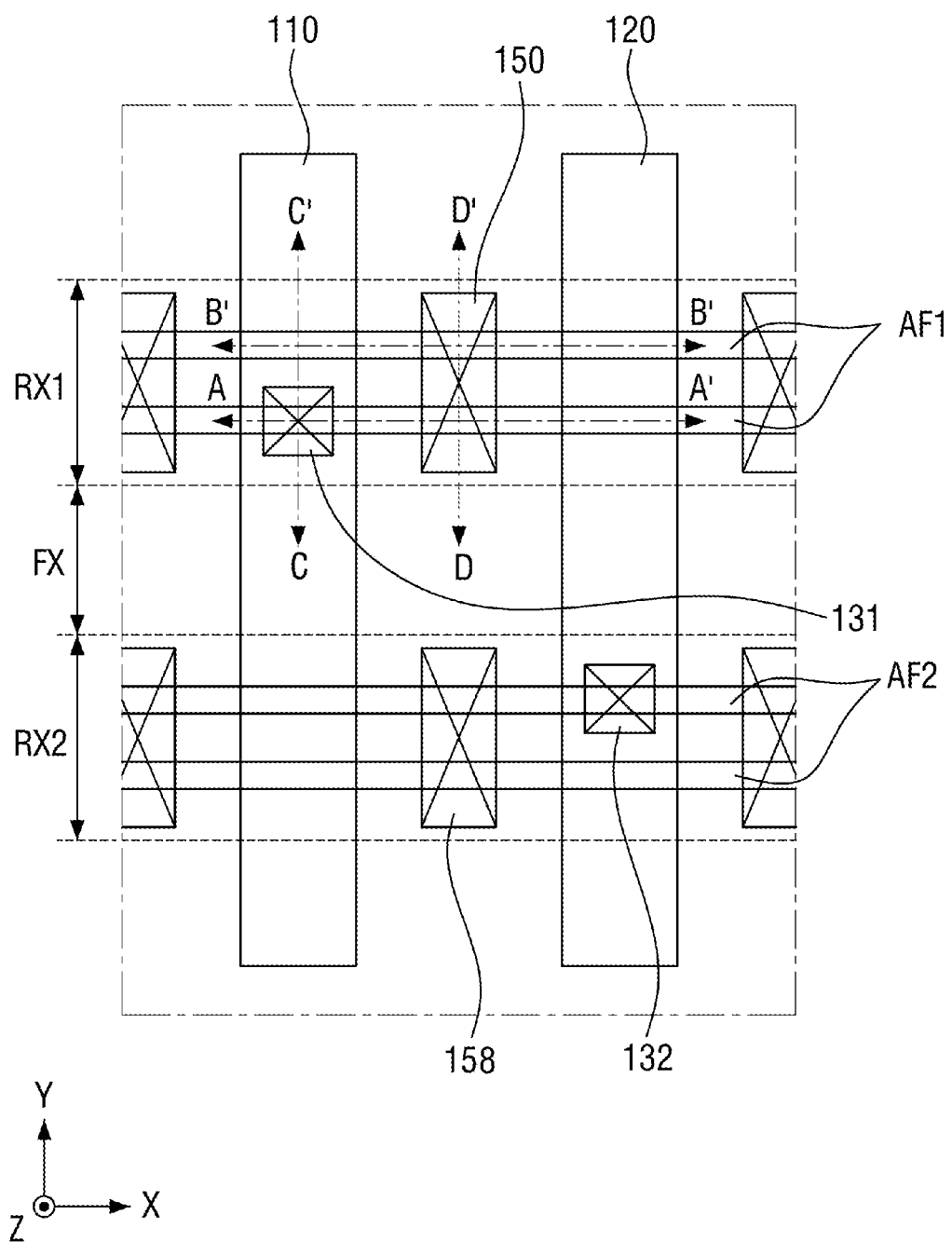
FIG. 1 is a plan view illustrating a semiconductor device according to embodiments of the inventive concept.
Figure 2:
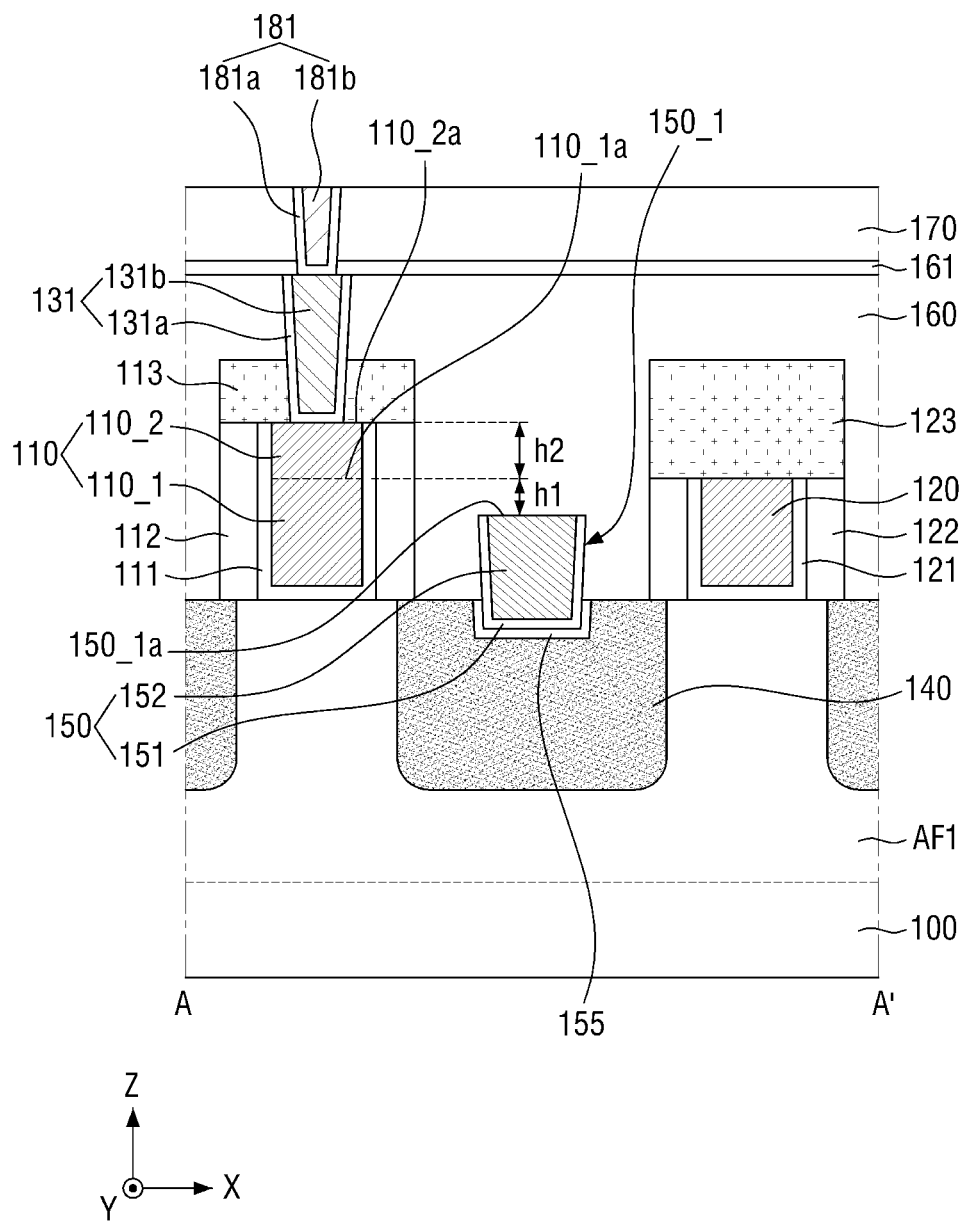
FIG. 2 is a cross-sectional view taken along a line A-A' of FIG. 1.
Figure 3:
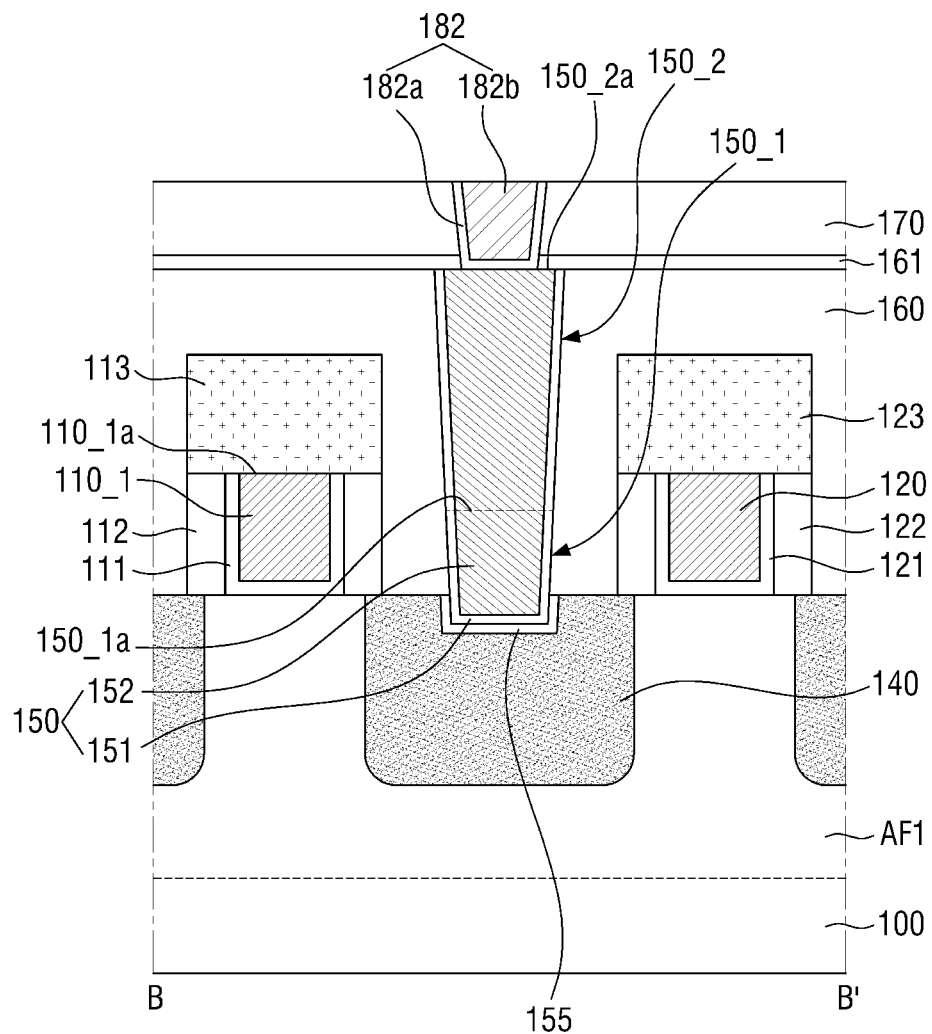
FIG. 3 is a cross-sectional view taken along a line B-B' of FIG. 1.
Figure 4:
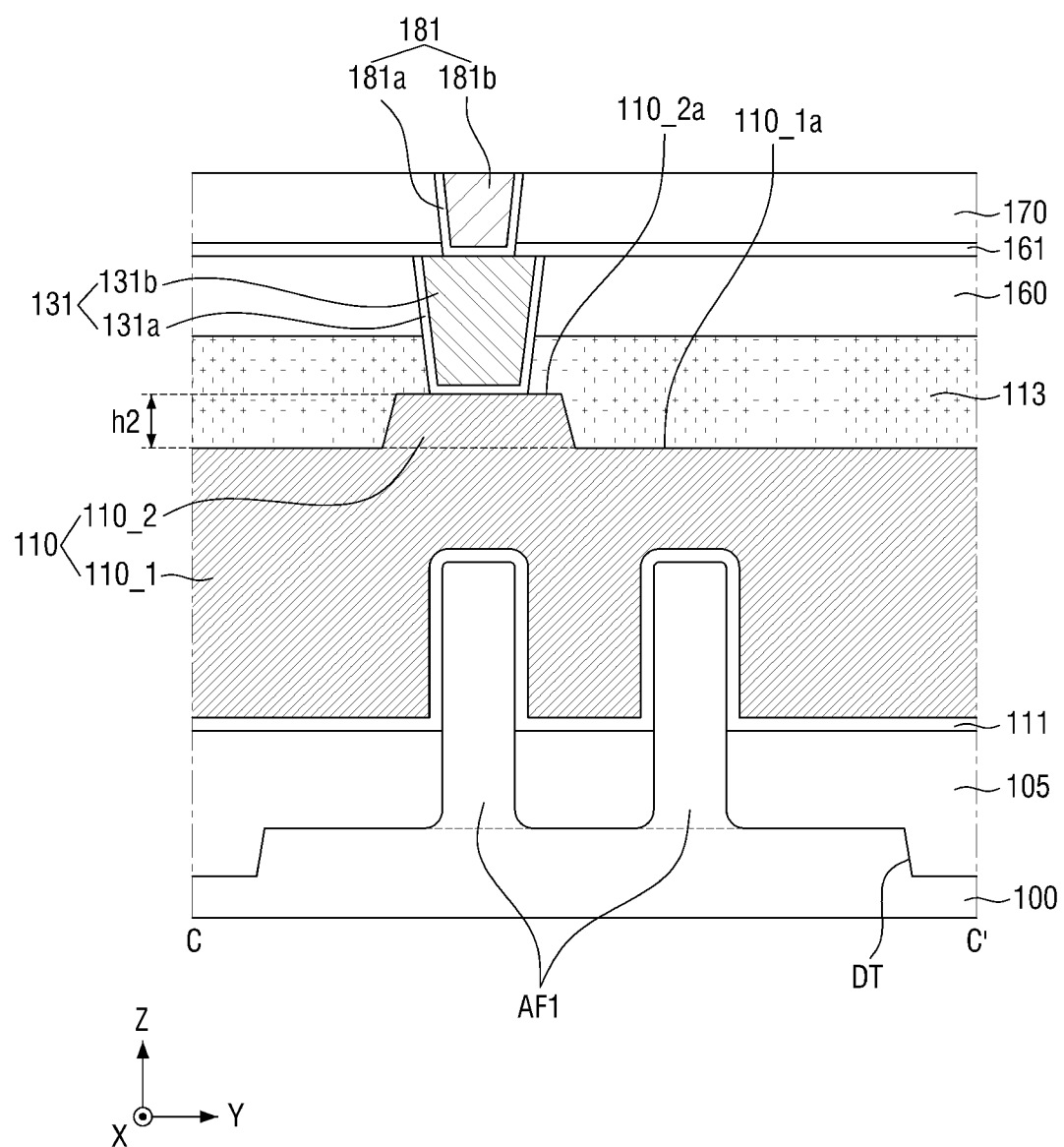
FIG. 4 is a cross-sectional view taken along a line C-C' of FIG. 1.
Figure 5:
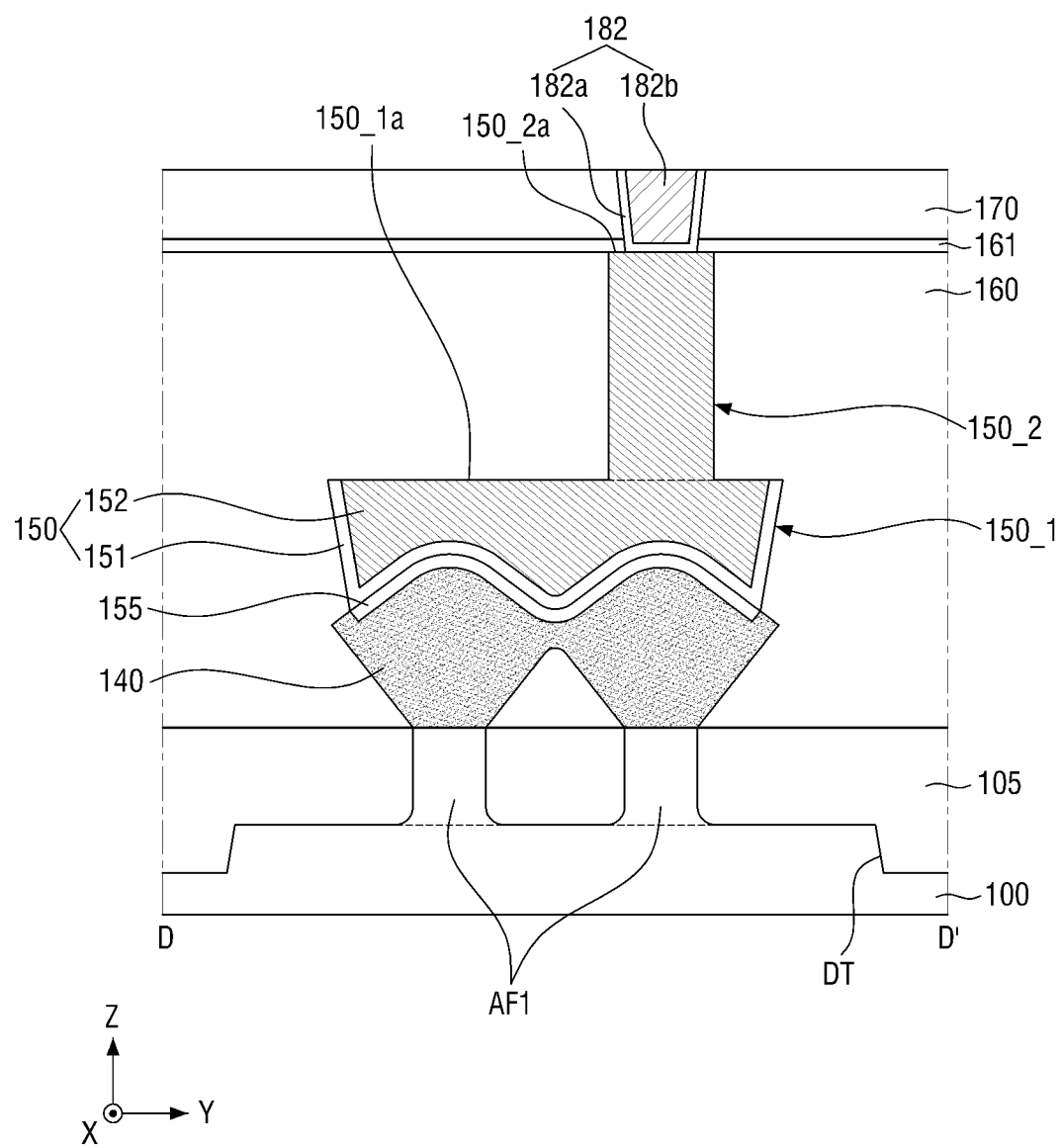
FIG. 5 is a cross-sectional view taken along a line D-D' of FIG. 1.

FIG. 1 is a plan (or top down) diagram illustrating a semiconductor device according to embodiments of the inventive concept. FIG. 2 is a cross-sectional view taken along a line A-A' of FIG. 1. FIG. 3 is a cross-sectional view taken along a line B-B' of FIG. 1. FIG. 4 is a cross-sectional view taken along a line C-C' of FIG. 1, and FIG. 5 is a cross-sectional view taken along a line D-D' of FIG. 1.

Referring to FIGS. 1 to 5, the semiconductor device may include a substrate 100, a field insulating film 105, a first active pattern AF1, a second active pattern AF2, a first gate electrode 110, a first gate insulating film 111, a first gate spacer 112, a first capping pattern 113, a second gate electrode 120, a second gate insulating film 121, a second gate spacer 122, a second capping pattern 123, a first gate contact 131, a second gate contact 132, a source/drain region 140, a first source/drain contact 150, a second source/drain contact 158, a silicide film 155, an etching stop film 161, a first interlayer insulating film 160, a second interlayer insulating film 170, a first via 181 and a second via 182.

The substrate 100 may include a first active region RX1, a second active region RX2 and a field region FX. The field region FX may be formed directly adjacent to the first active region RX1 and the second active region RX2. The field region FX may form a boundary between the first active region RX1 and the second active region RX2. Thus, in certain embodiments of the inventive concept, the first active region RX1 and the second active region RX2 may be spaced apart from each other (or separated) by the field region FX.

For example, an element isolation film may at least partially surround the respective peripheries of the first active region RX1 and the second active region RX2. Hence, a portion of the element isolation film existing between the first active region RX1 and the second active region RX2 may be designated as the field region FX. Here, a portion in which a channel region of a transistor is formed may be the active region, and a portion which divides the channel region may be the field region. Alternately, the active region may be a portion in which a fin-shaped pattern or nanowire used as the channel region of the transistor is formed, and the field region may be a region in which a fin-shaped pattern or nanowire used as a channel region is not formed. However, various possible designations between the field region and the active region are deemed to fall within the scope of ordinary skill in the art.

As illustrated in FIGS. 4 and 5, although the field region FX may be defined by a deep trench DT, the inventive concept is not limited thereto.

The substrate 100 may be a silicon substrate or a silicon-on-insulator (SOI). Alternatively, although the substrate 100 may include silicon germanium, silicon germanium on insulator (SGOI), indium antimonide, lead telluride, indium arsenide, indium phosphide, gallium arsenide or gallium antimonide, the inventive concept is not limited thereto.

The first active pattern AF1 may be formed in the first active region RX1. The first active pattern AF1 may protrude from the substrate 100 of the first active region RX1. The first active pattern AF1 may extend across the substrate 100 in a first horizontal direction (e.g., the X direction). The second active pattern AF2 may be formed in the second active region RX2, and the description of the second active pattern AF2 may be substantially the same as the description of the first active pattern AF1.

In certain embodiments, each first active pattern AF1 may be (e.g.,) a fin-type pattern, and the first active pattern AF1 may be used as the channel pattern of a transistor. Only two active patterns (i.e., the first active pattern AF1 and the two second active patterns AF2) are illustrated in FIG. 1 for convenience of explanation. However, those skilled in the art will recognize that inventive concept is not limited thereto.

Each of the first active pattern AF1 and the second active pattern AF2 may be formed from respective portions of the substrate 100 (e.g., may be formed from an epitaxial layer grown from the substrate 100). The first active pattern AF1 and the second active pattern AF2 may include one or more semiconductor material(s), such as silicon and/or germanium. In addition, the first active pattern AF1 and the second active pattern AF2 may respectively include a compound semiconductor (e.g., a group IV-IV compound semiconductor or a group III-V compound semiconductor).

Here, the group IV-IV compound semiconductor may be, for example, a binary compound containing at least two of carbon (C), silicon (Si), germanium (Ge) and tin (Sn), a ternary compound or a compound obtained by doping these elements with a group IV element. The group III-V compound semiconductors may be, for example, one of a binary compound, a ternary compound or a quaternary compound formed by combination of at least one of aluminum (Al), gallium (Ga) and indium (In) as a group III element with one of phosphorus (P), arsenic (As), and antimonium (Sb) as a group V element.

The field insulating film 105 may be formed on the substrate 100. The field insulating film 105 may be formed over the first active region RX1, the second active region RX2 and the field region FX. In certain embodiments of the inventive concept, the field insulating film 105 may be used to fill the deep trench DT.

The field insulating film 105 may be formed on part of a side wall of the first active pattern AF1 and part of a side wall of the second active pattern AF2. Each of the first active pattern AF1 and the second active pattern AF2 may protrude upward (in a vertical or Z direction) through an upper surface of the field insulating film 105. The field insulating film 105 may include, for example, an oxide film, a nitride film, an oxynitride film or a combination thereof.

The first gate electrode 110 may extend in a second horizontal direction (e.g., a Y direction) different from the X direction. The first gate electrode 110 may be disposed on the first active pattern AF1 and the second active pattern AF2. The first gate electrode 110 may intersect the first active pattern AF1 and the second active pattern AF2.

Although the first gate electrode 110 is shown as being disposed over the first active region RX1 and the second active region RX2, this is merely for convenience of explanation, and the inventive concept is not limited thereto. That is, in some other embodiments, the first gate electrode 110 may be divided into two parts that are respectively disposed on the first active region RX1 and the second active region RX2.

The first gate electrode 110 may include a first portion 110_1 and a second portion 110_2. The first portion 110_1 of the first gate electrode 110 may extend in the Y direction.

The second portion 110_2 of the first gate electrode 110 may be formed as a first protrusion vertically extending upward (in the Z direction) from the first portion 110_1 of the first gate electrode 110. The second portion 110_2 of the first gate electrode 110 may be disposed on the first active region RX1. The second portion 110_2 of the first gate electrode 110 may overlays at least one of the first active patterns AF1 in the Z direction.

An upper surface 110_1a of the first portion 110_1 of the first gate electrode 110 may be formed to be lower than an upper surface 110_2a of the second portion 110_2 of the first gate electrode 110. A height h2 (in the Z direction) between the upper surface 110_1a of the first portion 110_1 of the first gate electrode 110 and the upper surface 110_2a of the second portion 110_2 of the first gate electrode 110 may be in a range (e.g.,) from about 3 nm to about 10 nm.

The second gate electrode 120 may extend in the Y direction. The second gate electrode 120 may be spaced apart from the first gate electrode 110 in the X direction. The second gate electrode 120 may be disposed on the first active pattern AF1 and the second active pattern AF2. The second gate electrode 120 may intersect the first active pattern AF1 and the second active pattern AF2.

Although the second gate electrode 120 is shown as being disposed over the first active region RX1 and the second active region RX2, this is merely for convenience of explanation, and the inventive concept is not limited thereto. That is, in other embodiments, the second gate electrode 120 may be divided into two parts and the two part may be respectively disposed on the first active region RX1 and the second active region RX2.

The second gate electrode 120 may include a first portion and a second portion. The first portion of the second gate electrode 120 may extend in the Y direction.

The second portion of the second gate electrode 120 may be formed as a second protrusion extending vertically upward in the Z direction from the first portion of the second gate electrode 120. The second portion of the second gate electrode 120 may be disposed on the second active region RX2. The second portion of the second gate electrode 120 may overlay at least one of the second active patterns AF2 in the Z direction.

Each of the first gate electrode 110 and the second gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first gate electrode 110 and the second gate electrode 120 may include a conductive metal oxide, a conductive metal oxynitride, and the like, and may include a form in which the above-described material is oxidized.

The first gate spacer 112 may be disposed on a side wall of the first gate electrode 110. The second gate spacer 122 may be disposed on a side wall of the second gate electrode 120. Each of the first gate spacer 112 and the second gate spacer 122 may extend in the Y direction.

Each of the first gate spacer 112 and the second gate spacer 122 may include, for example, at least one of silicon nitride (SiN), silicon oxynitride (SiON), silicon oxide (SiO$_2$), silicon oxycarbo nitride (SiOCN), silicon boron nitride (SiBN), silicon boron oxynitride (SiOBN), silicon oxycarbide (SiOC), and combinations thereof.

Each of the first gate insulating film 111 and the second gate insulating film 121 may be disposed on the first active pattern AF1, the second active pattern AF2 and the field insulating film 105. The first gate insulating film 111 may be disposed between the first gate electrode 110 and the first gate spacer 112. The second gate insulating film 121 may be disposed between the second gate electrode 120 and the second gate spacer 122.

Each of the first gate insulating film 111 and the second gate insulating film 121 may be disposed along profiles of the first active pattern AF1 and the second active pattern AF2 protruding upward from the field insulating film 105, and the upper surface of the field insulating film 105. Although not shown in FIGS. 1 to 5, an interface film may be disposed along the profiles of the first active pattern AF1 and the second active pattern AF2 protruding upward from the field insulating film 105. Each of the first gate insulating film 111 and the second gate insulating film 121 may be disposed on the interface film.

Each of the first gate insulating film 111 and the second gate insulating film 121 may include silicon oxide, silicon oxynitride, silicon nitride or a high-k material having a dielectric constant higher than silicon oxide. The high-k material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first capping pattern 113 may extend in the Y direction on the first gate electrode 110, the first gate insulating film 111, and the first gate spacer 112. The second capping pattern 123 may extend in the Y direction on the second gate electrode 120, the second gate insulating film 121, and the second gate spacer 122.

The upper surfaces of each of the first gate electrode 110, the first gate insulating film 111, and the first gate spacer 112 may be formed on the same plane. That is, the first capping pattern 113 may be in contact with the upper surface of the first gate spacer 112. Further, the upper surfaces of each of the second gate electrode 120, the second gate insulating film 121, and the second gate spacer 122 may be formed on the same plane. That is, the second capping pattern 123 may be in contact with the upper surface of the second gate spacer 122. However, the inventive concept is not limited thereto.

In some other embodiments, the first capping pattern 113 may be disposed on the first gate electrode 110 and the first gate insulating film 111 between the first gate spacers 112. The second capping pattern 123 may be disposed on the second gate electrode 120 and the second gate insulating film 121 between the second gate spacers 122.

In some other embodiments, the first capping pattern 113 may be disposed on the first gate electrode 110 between the first gate insulating films 111, and the second capping pattern 123 may be disposed on the second gate electrode 120 between the second gate insulating films 121.

A thickness (measured in the Z direction) of the first capping pattern 113 disposed on the second portion 110_2 of the first gate electrode 110 may be less than a thickness of the first capping pattern 113 disposed on the first portion 110_1 of the first gate electrode 110. Further, a thickness of the second capping pattern 123 disposed on the second portion of the second gate electrode 120 may be less than a thickness of the second capping pattern 123 disposed on the first portion of the second gate electrode 120.

Each of the first capping pattern 113 and the second capping pattern 123 may include, for example, at least one of silicon nitride (SiN), silicon oxynitride (SiON), silicon oxide (SiO$_2$), silicon carbonitride (SiCN), silicon oxycarbonitride (SiOCN) and combinations thereof.

In FIGS. 2 and 3, although lower surfaces of each of the first capping pattern 113 and the second capping pattern 123 are shown to have as planar shape, the inventive concept is not limited thereto.

The source/drain region 140 may be formed on the first active pattern AF1. The source/drain region 140 may be disposed in (or on) the substrate 100. The source/drain region 140 may be disposed on at least one side of the first gate electrode 110. The source/drain region 140 may be disposed between the first gate electrode 110 and the second gate electrode 120. The source/drain region 140 may include an epitaxial pattern. The source/drain region 140 may be included in a source/drain of a transistor that uses the first active pattern AF1 as a channel region.

Although FIG. 5 shows the source/drain region 140 formed by merging two epitaxial patterns formed on the respective first active pattern AF1, this is merely one example of various techniques that may be used and the inventive concept is not limited thereto. That is, in other embodiments, the epitaxial patterns formed on the respective first active patterns AF1 may be separated from each other.

The first gate contact 131 may be disposed on the second portion 110_2 of the first gate electrode 110. The first gate contact 131 may be disposed on the first active region RX1.

The first gate contact 131 may overlay at least one of the first active patterns AF1 in the Z direction.

The first gate contact 131 may penetrate through the first capping pattern 113 disposed on the second portion 110_2 of the first gate electrode 110 in the Z direction, and may be connected to the second portion 110_2 of the first gate electrode 110.

The first gate contact 131 may include a gate contact barrier film 131a, and a gate contact filling film 131b disposed on the gate contact barrier film 131a.

The second gate contact 132 may be disposed on the second portion of the second gate electrode 120. The second gate contact 132 may be disposed on the second active region RX2. The second gate contact 132 may overlay at least one of the second active patterns AF2 in the Z direction.

The second gate contact 132 penetrates through the second capping pattern 123 disposed on the second portion of the second gate electrode 120 in the Z direction, and may be connected to the second portion of the second gate electrode 120.

The second gate contact 132 may include a gate contact barrier film 131a, and a gate contact filling film 131b disposed on the gate contact barrier film 131a.

The first source/drain contact 150 may be disposed between the first gate electrode 110 and the second gate electrode 120 on the first active region RX1. The first source/drain contact 150 may extend in the Y direction. The first source/drain contact 150 may intersect the first active pattern AF1.

The first source/drain contact 150 may include a first portion 150_1 and a second portion 150_2. The first portion 150_1 of the first source/drain contact 150 may extend in the Y direction. The second portion 150_2 of the first source/drain contact 150 may be formed to protrude from the first portion 150_1 of the first source/drain contact 150 in the Z direction.

An upper surface 150_1a of the first portion 150_1 of the first source/drain contact 150 may be formed to be lower than the upper surface 110_1a of the first portion 110_1 of the first gate electrode 110. The height h1 (measured in the Z direction) between the upper surface 150_1a of the first portion 150_1 of the first source/drain contact 150 and the upper surface 110_1a of the first portion 110_1 of the first gate electrode 110 may be in a range (e.g.,) between about 2 nm to about 12 nm.

The first source/drain contact 150 may include a source/drain contact barrier film 151, and a source/drain contact filling film 152 disposed on the source/drain contact barrier film 151. The source/drain contact barrier film 151 may be disposed along a side wall and a bottom surface of the first portion 150_1 of the first source/drain contact 150. The source/drain contact barrier film 151 may not be disposed on the upper surface of the first portion 150_1 of the first source/drain contact 150 and the side wall of the second portion 150_2 of the first source/drain contact 150.

An upper surface 150_2a of the second portion 150_2 of the first source/drain contact 150 may be formed on the same plane as the upper surface of the first gate contact 131. However, the inventive concept is not limited thereto.

The second source/drain contact 158 may be disposed between the first gate electrode 110 and the second gate electrode 120 on the second active region RX2. The second source/drain contact 158 may extend in the Y direction. The second source/drain contact 158 may intersect the second active pattern AF2.

The second source/drain contact 158 may include a first portion and a second portion. The first portion of the second source/drain contact 158 may extend in the Y direction. The second portion of the second source/drain contact 158 may be formed to protrude from the first portion of the second source/drain contact 158 in the Z direction.

The second source/drain contact 158 may include a source/drain contact barrier film 151, and a source/drain contact filling film 152 disposed on the source/drain contact barrier film 151.

The upper surface of the second portion of the second source/drain contact 158 may be formed on the same plane as the upper surface of the second gate contact 132. However, the inventive concept is not limited thereto.

The silicide film 155 may be disposed between the source/drain region 140 and the first source/drain contact 150. Although the silicide film 155 is shown as being formed along the profile of the interface surface between the source/drain region 140 and the first source/drain contact 150, the inventive concept is not limited thereto. The silicide film 155 may include, for example, a metal silicide material.

The first interlayer insulating film 160 may be disposed on the field insulating film 105. The first interlayer insulating film 160 may surround the side wall of the first gate contact 131, the side wall of the second gate contact 132, the side wall of the first source/drain contact 150, and the side wall of second source/drain contact 158.

The first interlayer insulating film 160 may be in direct contact with each of the side wall of the first capping pattern 113 and the side wall of the second capping pattern 123. However, the inventive concept is not limited thereto.

The first interlayer insulating film 160 may include, for example, at least one of silicon oxide, silicon nitride, silicon oxynitride, and a low-k material. The low-k material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the inventive concept is not limited thereto.

The etching stop film 161 may be disposed on the first interlayer insulating film 160. The etching stop film 161 may include, for example, at least one of silicon nitride (SiN), silicon oxynitride (SiON), silicon carbonitride (SiCN), and silicon oxycarbide (SiCO).

The second interlayer insulating film 170 may be disposed on the etching stop film 161. The second interlayer insulating film 170 may include, for example, at least one of silicon oxide, silicon nitride, silicon oxynitride, and a low-k material.

The first via 181 may be disposed on the first gate contact 131. The first via 181 may penetrate through the etching stop film 161 and the second interlayer insulating film 170 and extend in the Z direction. The first via 181 may be directly connected to the first gate contact 131.

The first via 181 may include a first via barrier film 181*a*, and a first via filling film 181*b* disposed on the first via barrier film 181*a*.

The second via 182 may be disposed on the second portion 150_2 of the first source/drain contact 150. The second via 182 may penetrate through the etching stop film 161 and the second interlayer insulating film 170 and extend in the Z direction. The second via 182 may be directly connected to the second portion 150_2 of the first source/drain contact 150.

The second via 182 may include a second via barrier film 182*a*, and a second via filling film 182*b* disposed on the second via barrier film 182*a*.

Each of the first via barrier film 181*a* and the second via barrier film 182*a* may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). A wiring filling film 210*b* may include, for example, at least one of aluminum (Al), copper (Cu), tungsten (W), cobalt (Co), ruthenium (Ru), and molybdenum (Mo).

In certain semiconductor devices according embodiments of the inventive concept, since part of the gate electrode directly connected to the gate contact on the active region is formed as a vertical protrusion (i.e., a portion vertically protruding upward in the Z direction), it is possible to secure a shorter margin between the gate contact and the source/drain contact.

Hereinafter, a semiconductor device according to other embodiments of the inventive concept will be described with reference to FIGS. 6 and 7. Here, the description of the embodiments illustrated in FIGS. 6 and 7 will focus primarily on differences with the semiconductor device illustrated in FIGS. 2 and 5. Thus, FIGS. 6 and 7 are cross-sectional views illustrating embodiments of the inventive concept.

Figure 6:
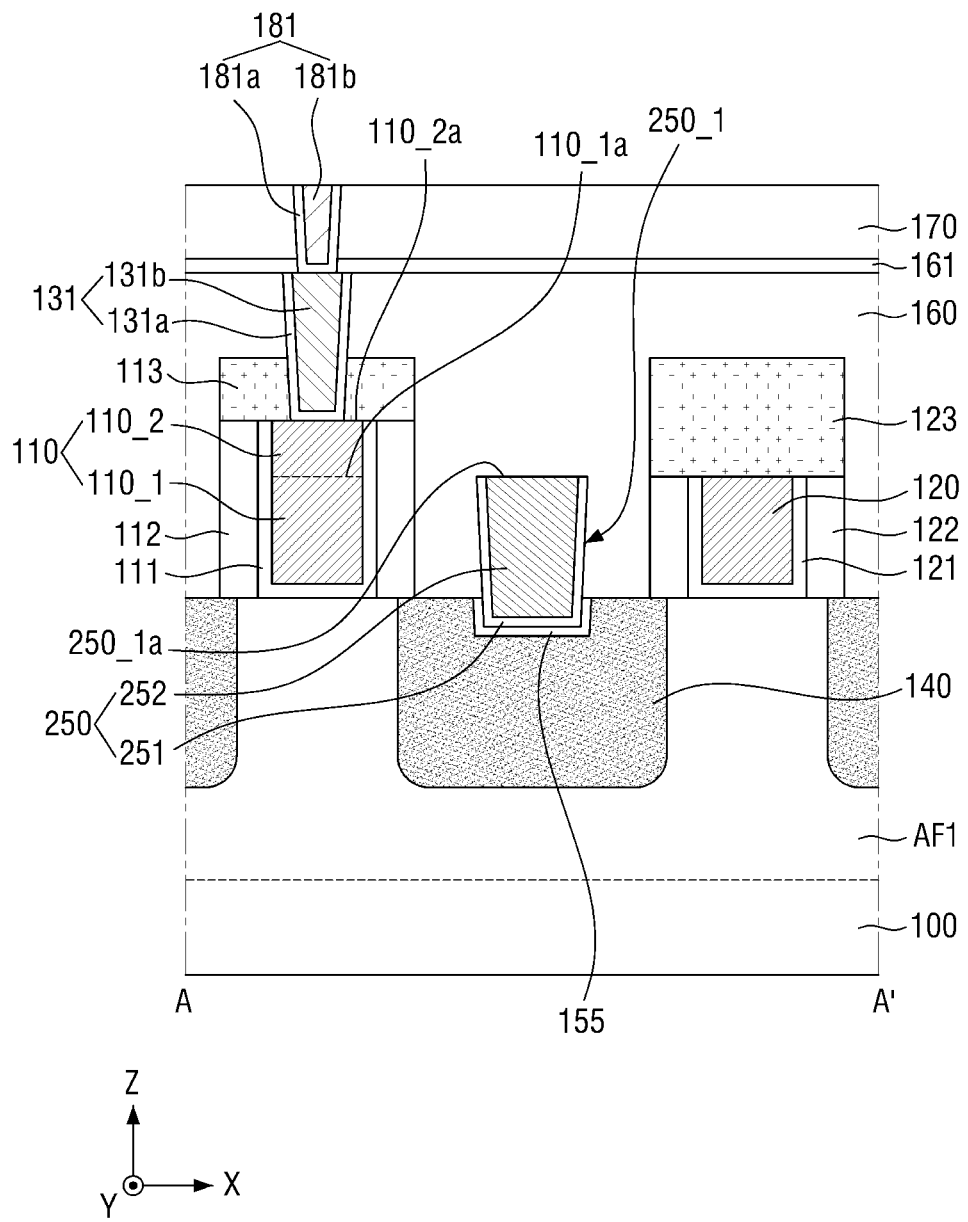
FIGS. 6 and 7 are cross-sectional views for explaining some other embodiments of the inventive concept.
Figure 7:
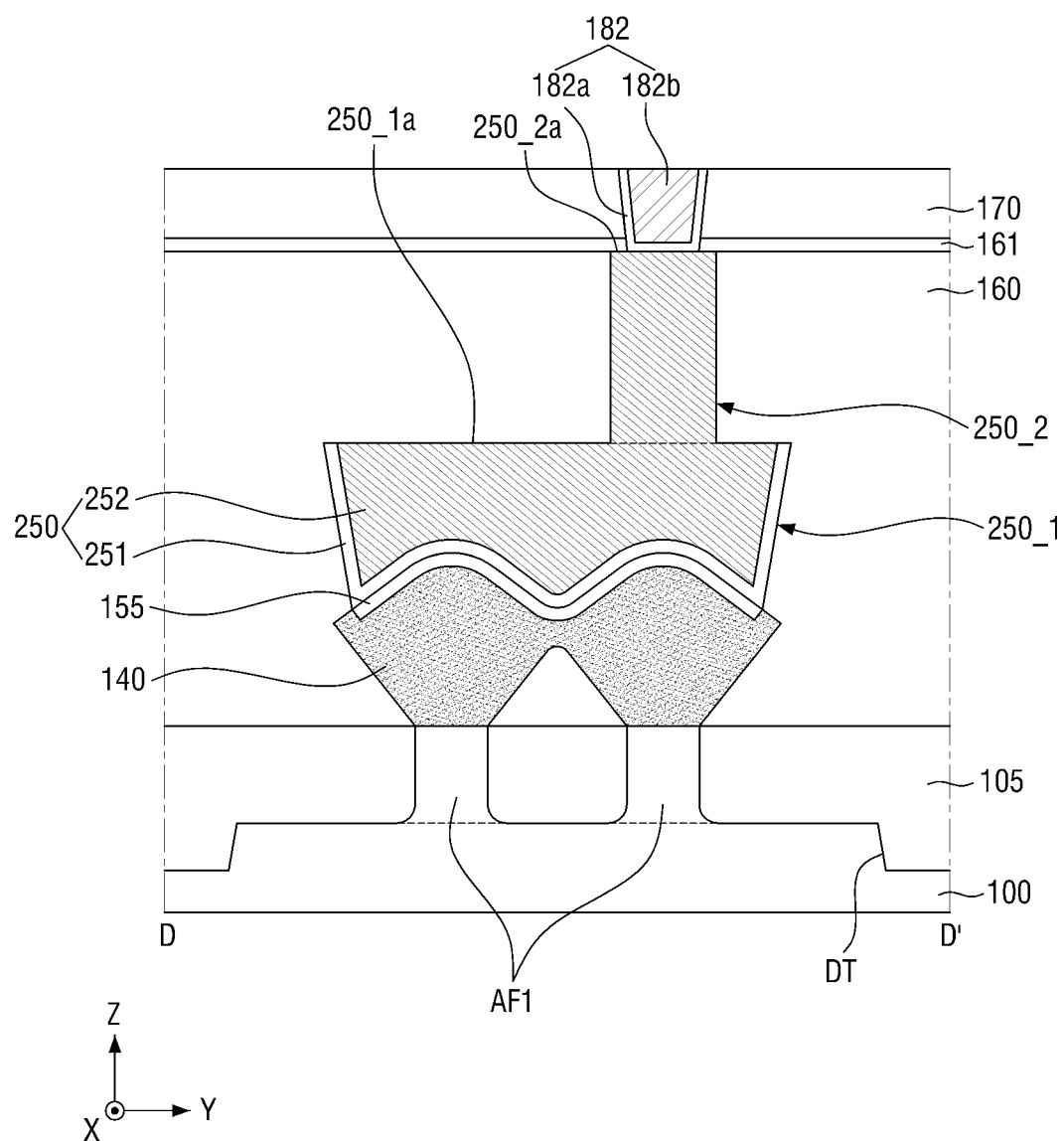

Referring to FIGS. 6 and 7, in the semiconductor device, an upper surface 250_1*a* of a first portion 250_1 of a first source/drain contact 250 may be formed co-planer with (i.e., on the same vertical plane as) the upper surface 110_1*a* of the first portion 110_1 of the first gate electrode 110.

Here, a second portion 250_2 of the first source/drain contact 250 may be formed as a vertical protrusion from the first portion 250_1 of the first source/drain contact 250 in the Z direction. An upper surface 250_2*a* of a second portion 250_2 of the first source/drain contact 250 may be formed co-planar with the upper surface of the first interlayer insulating film 160.

The first source/drain contact 250 may include a source/drain contact barrier film 251, and a source/drain contact filling film 252 disposed on the source/drain contact barrier film 251.

Hereinafter, a semiconductor device according to embodiments of the inventive concept will be described with reference to FIGS. 8 and 9. The description of the embodiments illustrated in FIGS. 8 and 9 will focus primarily on differences with the semiconductor device illustrated in FIGS. 2 and 5. Thus, FIGS. 8 and 9 are cross-sectional views illustrating embodiments of the inventive concept.

Figure 8:
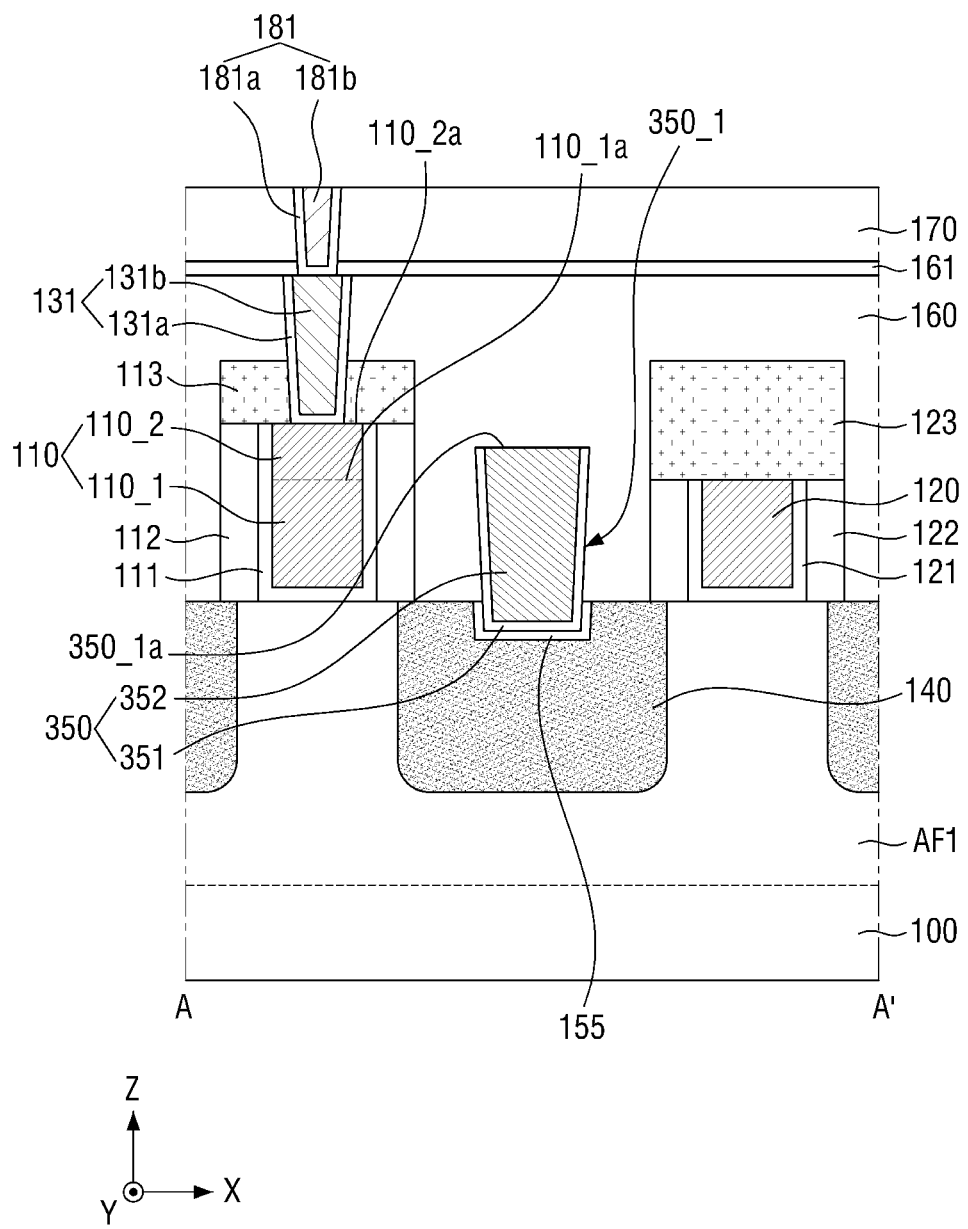
FIGS. 8 and 9 are cross-sectional views for explaining some other embodiments of the inventive concept.
Figure 9:
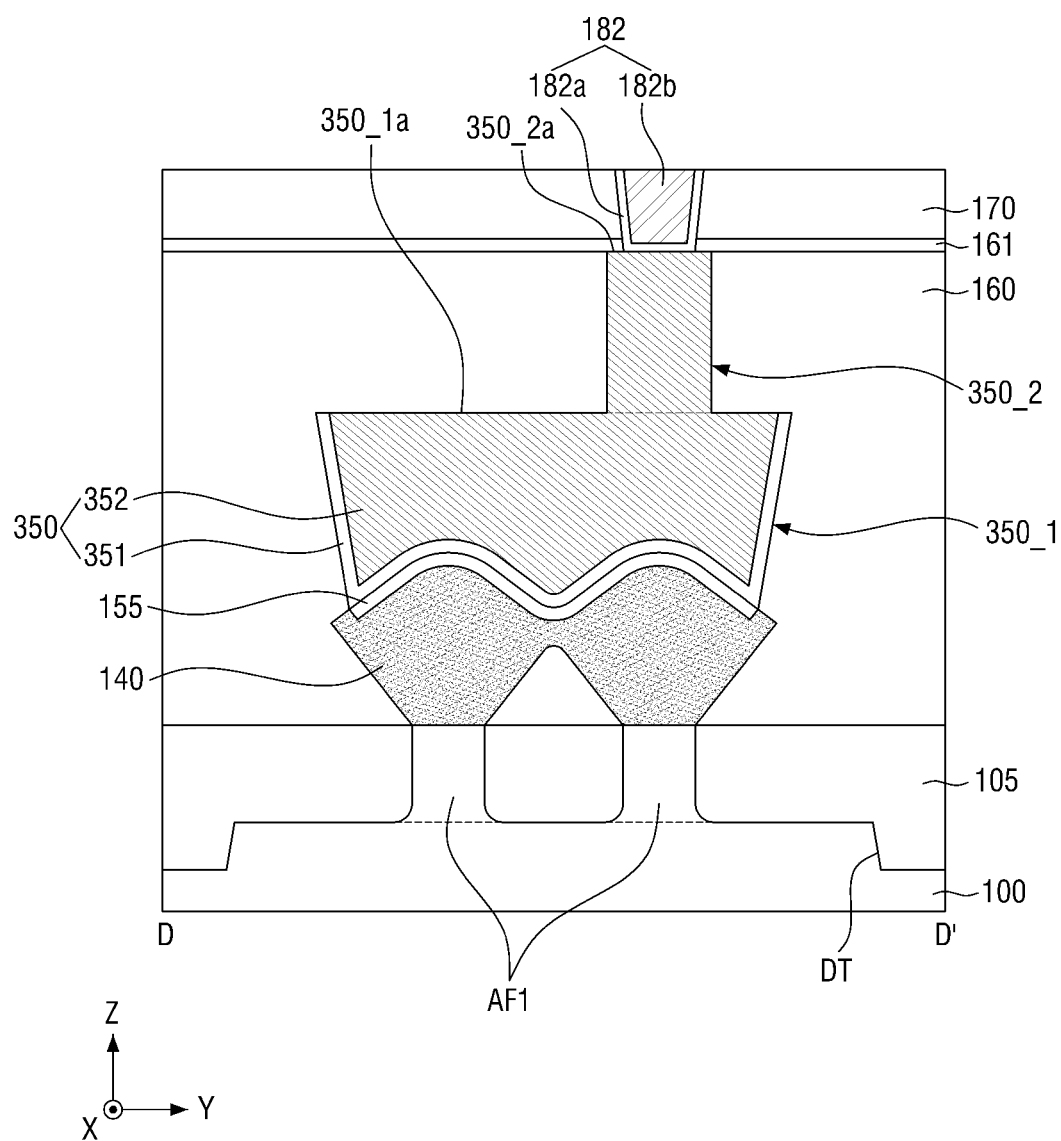

Referring to FIGS. 8 and 9, in the semiconductor device, an upper surface 350_1*a* of a first portion 350_1 of a first source/drain contact 350 may be formed at a height ranging between the upper surface 110_1*a* of the first portion 110_1 of the gate electrode 110 and the upper surface 110_2*a* of the second portion 110_2 of the first gate electrode 110.

A second portion 350_2 of the first source/drain contact 350 may be formed as a vertical protrusion from the first portion 350_1 of the first source/drain contact 350 in the Z direction. The upper surface 350_2*a* of the second portion 350_2 of the first source/drain contact 350 may be formed to be co-planar with the upper surface of the first interlayer insulating film 160.

The first source/drain contact 350 may include a source/drain contact barrier film 351, and a source/drain contact filling film 352 disposed on the source/drain contact barrier film 351.

Hereinafter, a semiconductor device according to embodiments of the inventive concept will be described with reference to FIGS. 10 and 11. The description of the embodiments illustrated in FIGS. 10 and 11 will focus primarily on differences with the semiconductor device illustrated in FIGS. 2 and 5. Thus, FIGS. 10 and 11 are cross-sectional views illustrating embodiments of the inventive concept.

Figure 10:
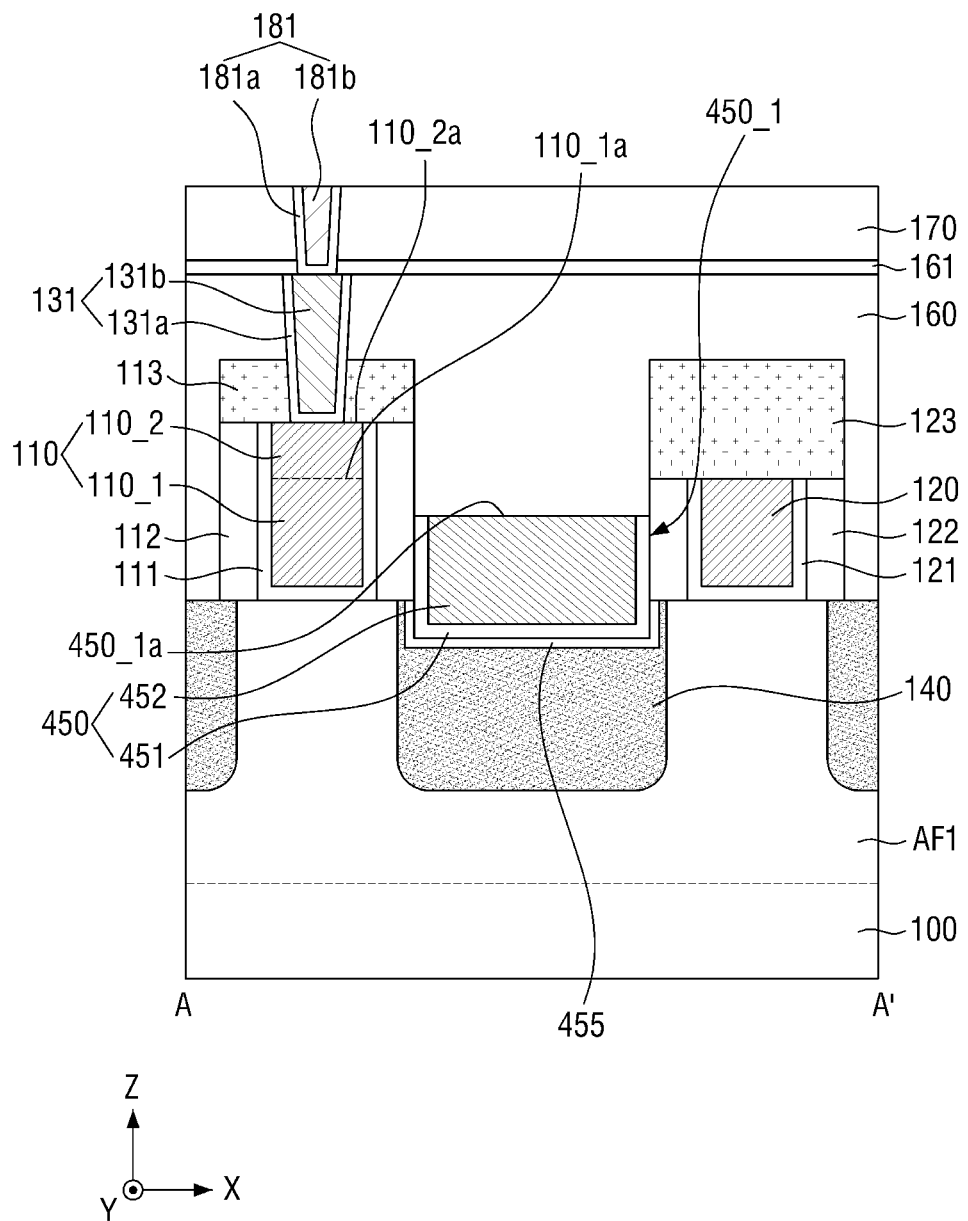
FIGS. 10 and 11 are cross-sectional views for explaining some other embodiments of the inventive concept.
Figure 11:
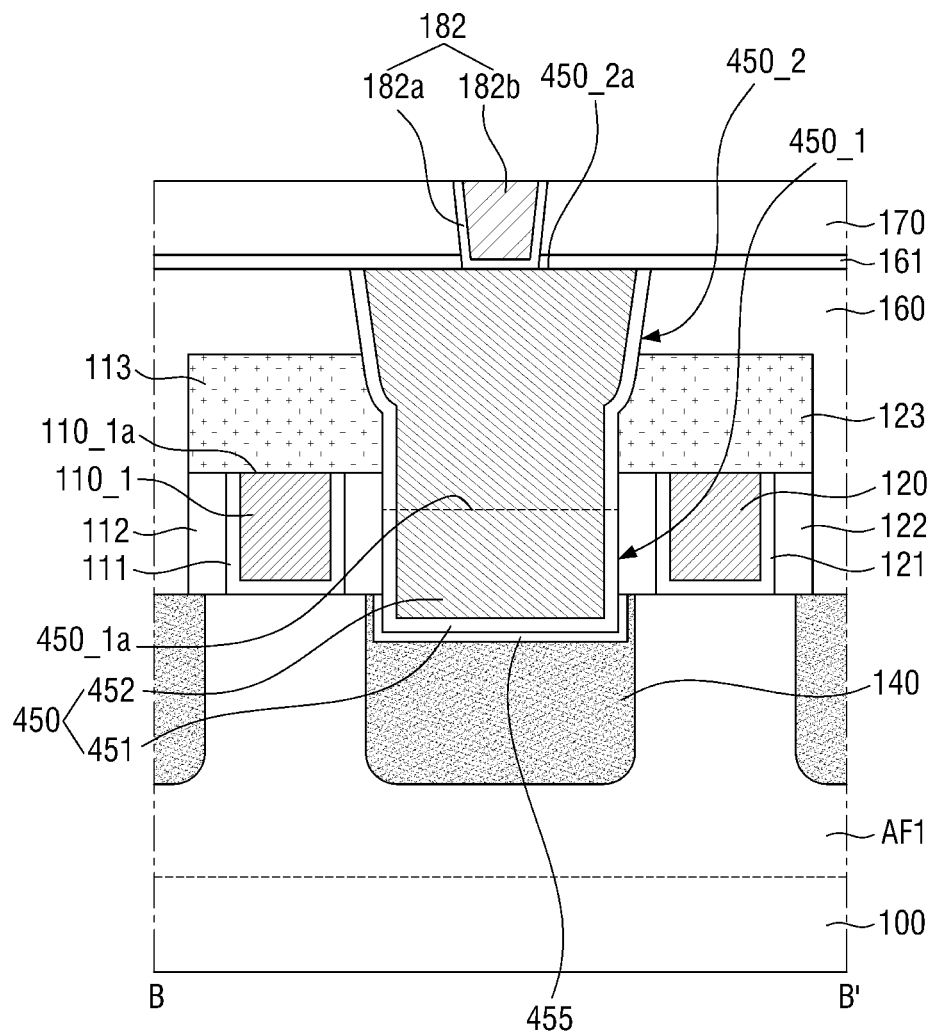
Figure 11:
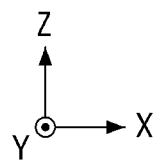

Referring to FIGS. 10 and 11, in the semiconductor device, at least part of the first source/drain contact 450 may contact a capping pattern.

That is, a first portion 450_1 of a first source/drain contact 450 may contact each of the first gate spacer 112 and the second gate spacer 122. Here, the first interlayer insulating film 160 may not be disposed between the first portion 450_1 of the first source/drain contact 450 and the first gate spacer 112, and between the first portion 450_1 of the first source/drain contact 450 and the second gate spacer 122.

At least part of the second portion 450_2 of the first source/drain contact 450 may be formed with an indentation towards at least one of the first capping pattern 113 and the second capping pattern 123.

An upper surface 450_1a of the first portion 450_1 of the first source/drain contact 450 may be formed to be lower than the upper surface 110_1a of the first portion 110_1 of the first gate electrode 110.

A second portion 450_2 of the first source/drain contact 450 may be formed as a vertical protrusion from the first portion 450_1 of the first source/drain contact 450 in the Z direction. An upper surface 450_2a of the second portion 450_2 of the first source/drain contact 450 may be formed to be co-planar with the upper surface of the first interlayer insulating film 160.

The first source/drain contact 450 may include a source/drain contact barrier film 451, and a source/drain contact filling film 452 disposed on the source/drain contact barrier film 451.

A silicide film 455 may be disposed between the source/drain region 140 and the first source/drain contact 450.

Hereinafter, a semiconductor device according to embodiments of the inventive concept will be described with reference to FIG. 12. The description of the embodiment illustrated in FIG. 12 will focus primarily on differences with the semiconductor device illustrated in FIGS. 2 and 5. Thus, FIG. 12 is a cross-sectional view illustrating an embodiment of the inventive concept.

Figure 12:
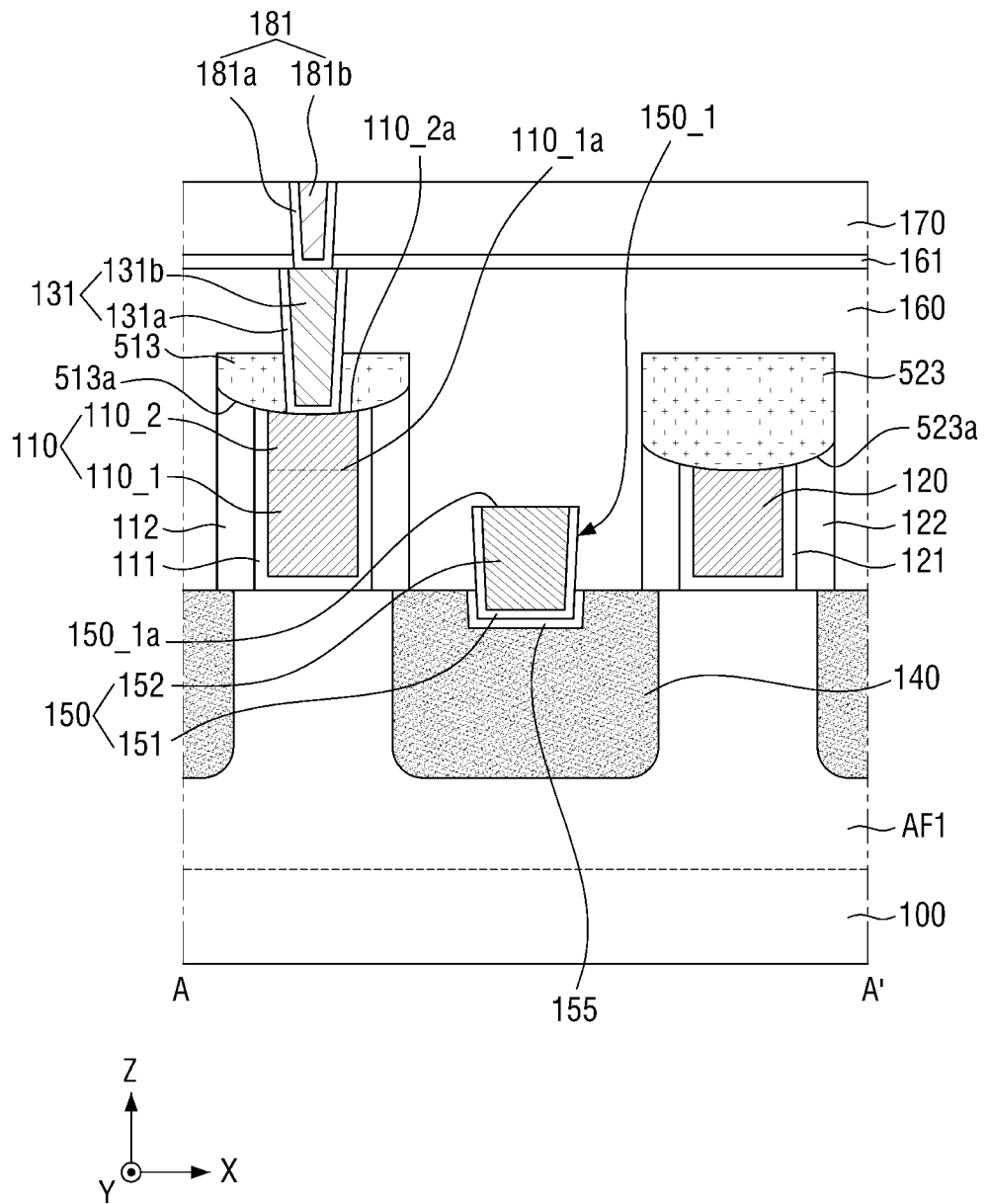
FIG. 12 is a cross-sectional view for explaining some other embodiments of the inventive concept.

Referring to FIG. 12, in the semiconductor device, a lower surface 513a of a first capping pattern 513 may be formed with an upward-facing, concave shape on the first gate electrode 110, and a lower surface 523a of a second capping pattern 523 may be formed with an upward-facing, concave shape on the second gate electrode 120.

Hereinafter, a semiconductor device according to embodiments of the inventive concept will be described with reference to FIG. 13. The description of the embodiment illustrated in FIG. 13 will focus primarily on differences with the semiconductor device illustrated in FIGS. 2 and 5. Thus, FIG. 13 is a cross-sectional view illustrating an embodiment of the inventive concept.

Figure 13:
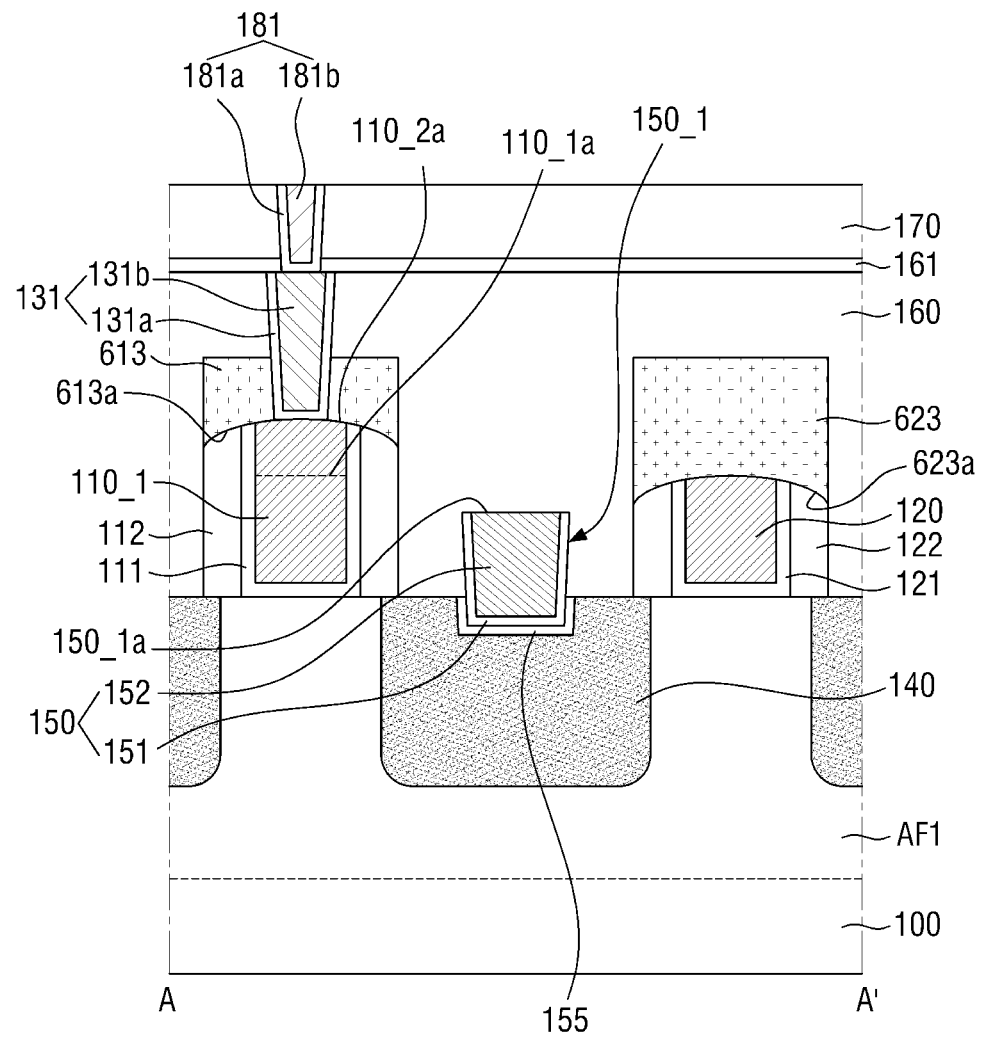
FIG. 13 is a cross-sectional view for explaining some other embodiments of the inventive concept.

Referring to FIG. 13, in the semiconductor device, a lower surface 613a of a first capping pattern 613 may be formed with a downward-facing convex shape on the upper surface of the first capping pattern 613, and a lower surface 623a of a second capping pattern 623 may be formed with the downward-facing convex shape on the upper surface of the second capping pattern 623.

Hereinafter, a semiconductor device according to embodiments of the inventive concept will be described with reference to FIGS. 14, 15 and 16. The description of the embodiments illustrated in FIGS. 14, 15 and 16 will focus primarily on differences with the semiconductor device illustrated in FIGS. 2 to 5. Hence, FIGS. 14, 15 and 16 are cross-sectional views illustrating embodiments of the inventive concept.

Figure 14:
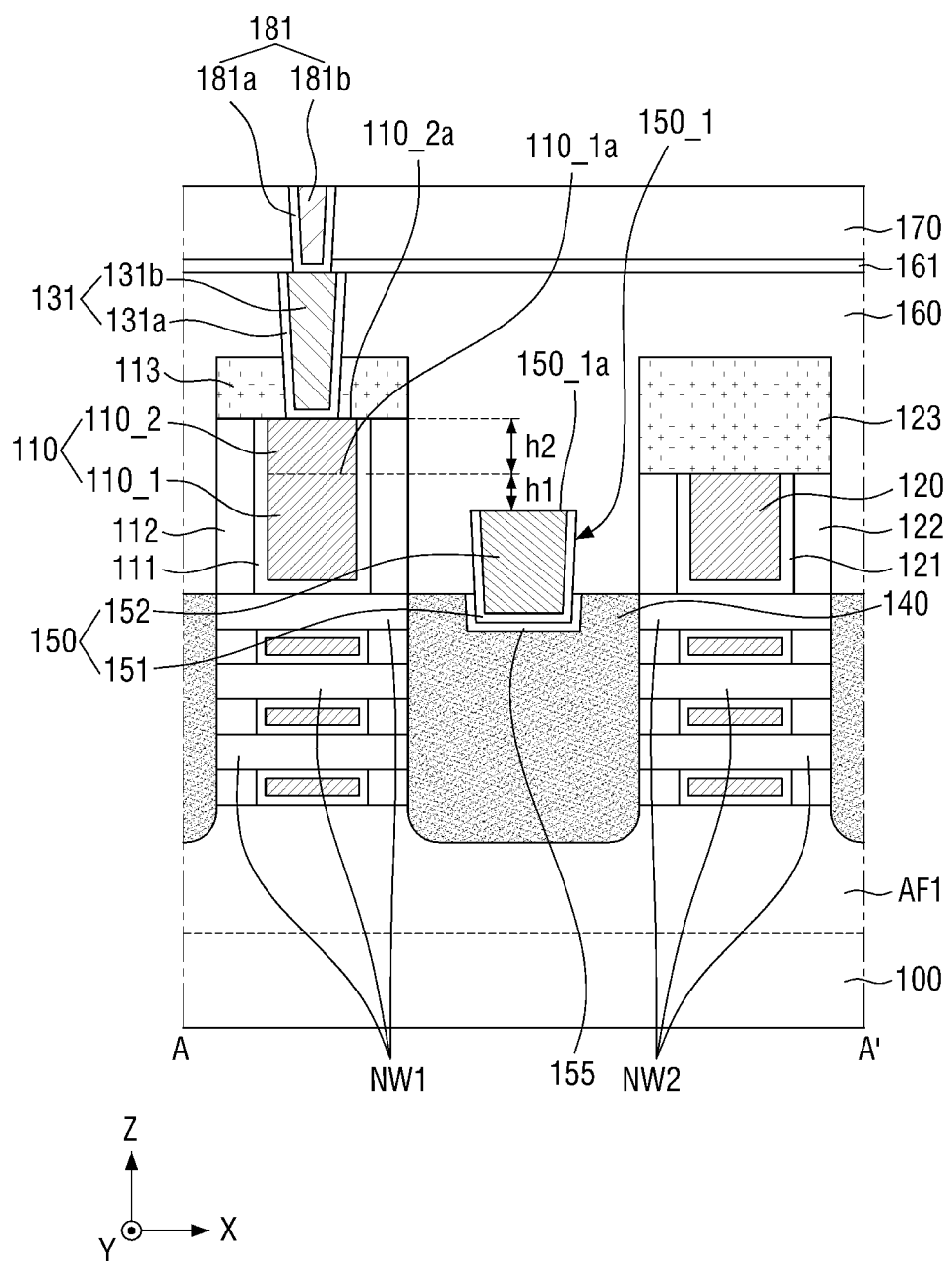
FIGS. 14 to 16 are cross-sectional views for explaining some other embodiments of the inventive concept.
Figure 15:
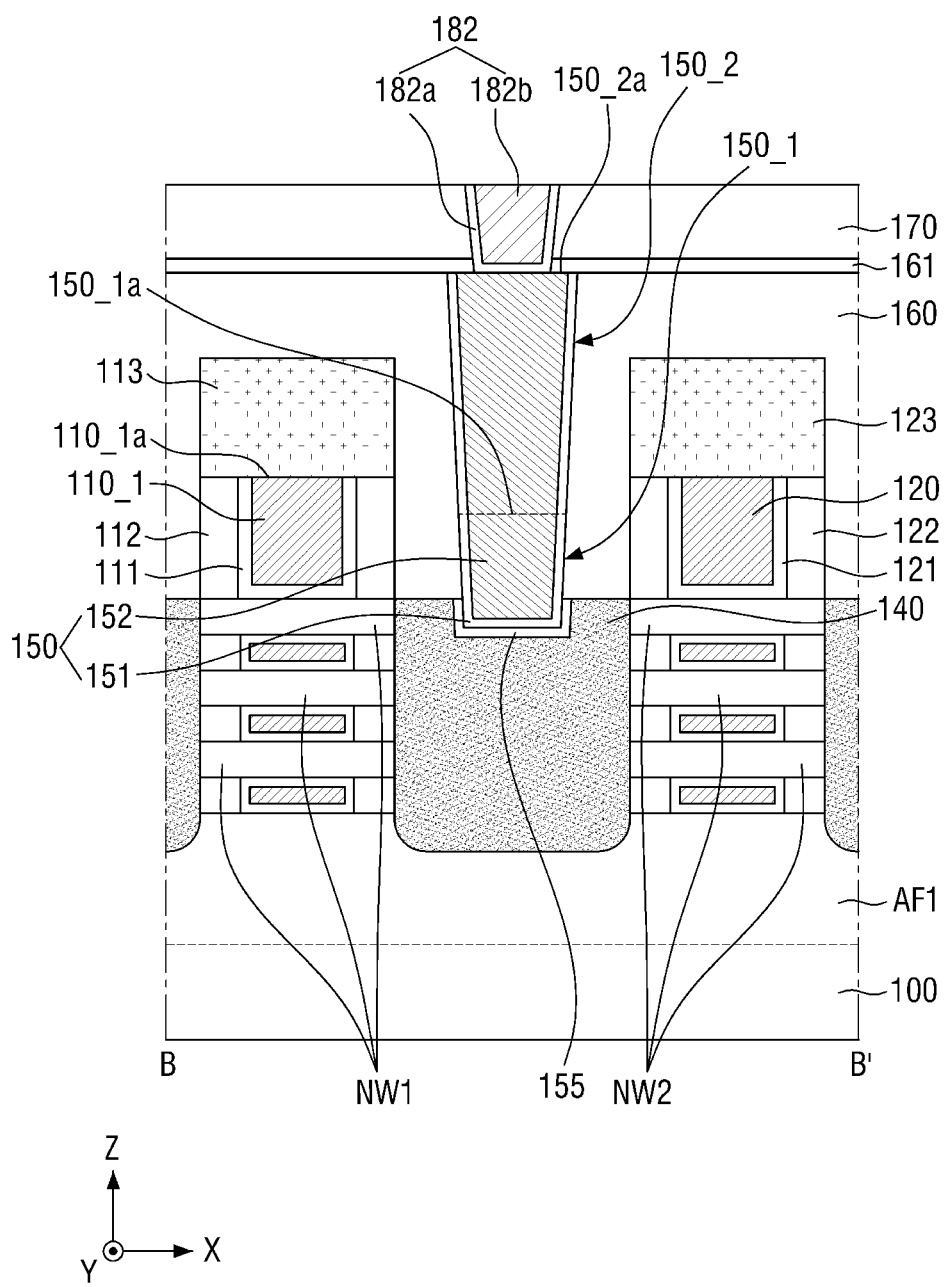
Figure 16:
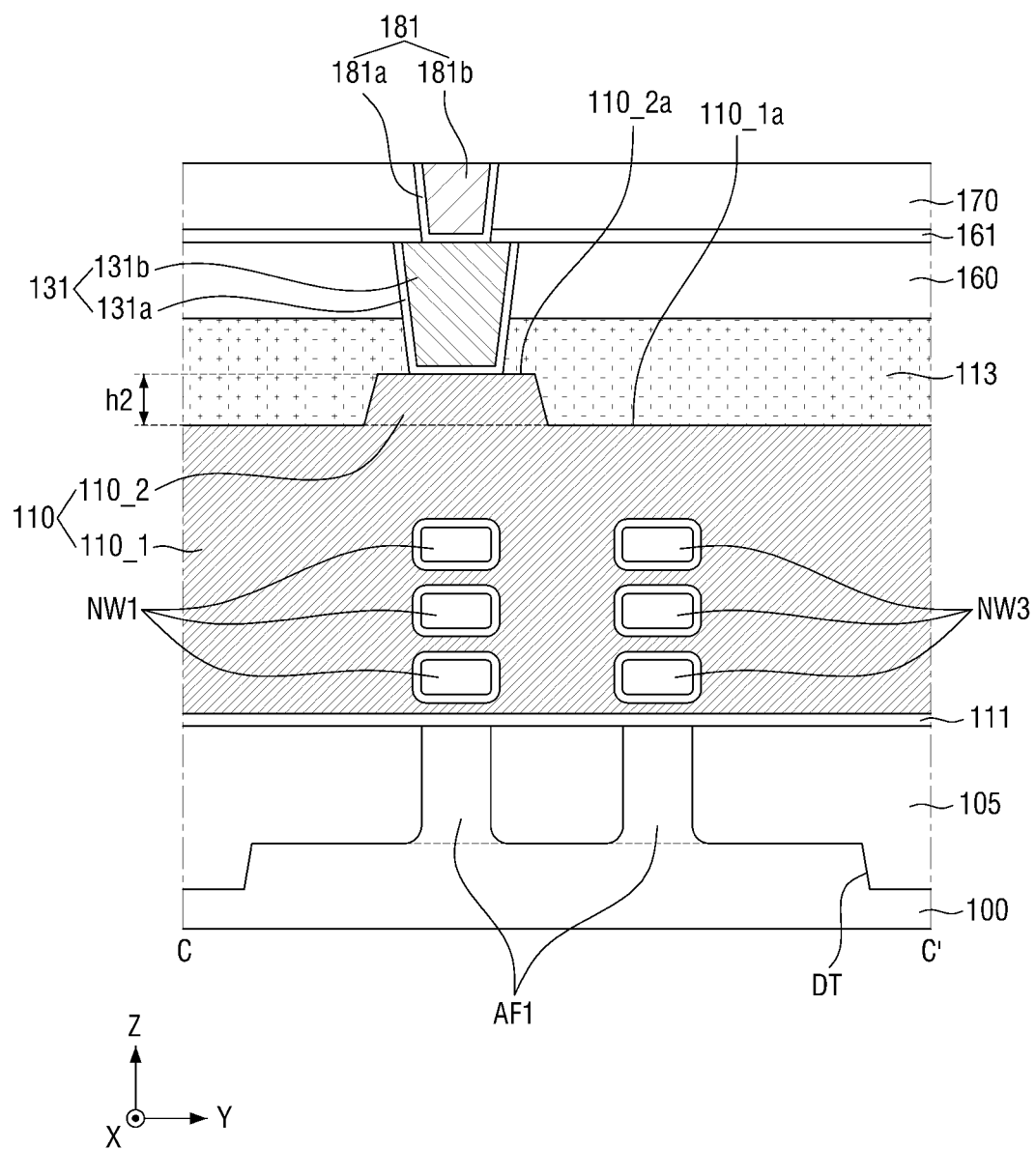

Referring to FIGS. 14, 15 and 16, a semiconductor device according to embodiments of the inventive concept may include a Multi-Bridge Channel Field Effect Transistor (MBCFET™). That is, the semiconductor device may include nanowires sequentially stacked on the substrate and vertically spaced apart from each other in the Z direction.

For example, a first plurality of nanowires NW1 may be sequentially stacked on the first active pattern AF1 spaced apart from each other in the Z direction, where each of the first plurality of nanowires NW1 extends in the X direction. A second plurality of nanowires NW2 may be sequentially stacked on the first active pattern AF1 spaced apart from each other in the Z direction, where each of the second plurality of nanowires NW2 extends in the X direction. And a third plurality of nanowires NW3 may be sequentially stacked on the first active pattern AF1 spaced apart from each other in the Z direction, where each of the third plurality of nanowires NW3 extends in the X direction. Here, the third plurality of nanowires NW3 may be spaced apart from the first plurality of nanowires NW1 in the Y direction.

Although FIGS. 14, 15 and 16 show respective, first, second and third pluralities of nanowires NW1, NW2 and NW3 including three (3) nanowires, this is merely for convenience of explanation, and the inventive concept is not limited thereto.

The first gate electrode 110 may surround each of the first plurality of nanowires NW1 and the third plurality of nanowires NW3. The second gate electrode 120 may surround the second plurality of nanowires NW2.

The first gate spacer 112 may be disposed on both sides of the first gate electrode 110 in the X direction. The second gate spacer 122 may be disposed on both sides of the second gate electrode 120 in the X direction.

The first gate insulating film 111 may be disposed between the first gate electrode 110 and the first plurality of nanowires NW1, between the first gate electrode 110 and the third plurality of nanowires NW3, between the first gate electrode 110 and the first gate spacer 112, between the first gate electrode 110 and the first active pattern AF1, and between the first gate electrode 110 and the field insulating film 105.

The second gate insulating film 121 may be disposed between the second gate electrode 120 and the second plurality of nanowires NW2, between the second gate electrode 120 and the second gate spacer 122, between the second gate electrode 120 and the first active pattern AF1, and between the second gate electrode 120 and the field insulating film 105.

The first gate contact 131 may overlay the first plurality of nanowires NW1 in the Z direction. The source/drain region 140 may be disposed on at least one sides of each of the first, second and third nanowires NW1, NW2 and NW3.

Hereinafter, one example of a method of fabricating a semiconductor device according to embodiments of the inventive concept will be described with reference to FIGS. 4, 17, 18, 19, 20, and 21.

Figure 17:
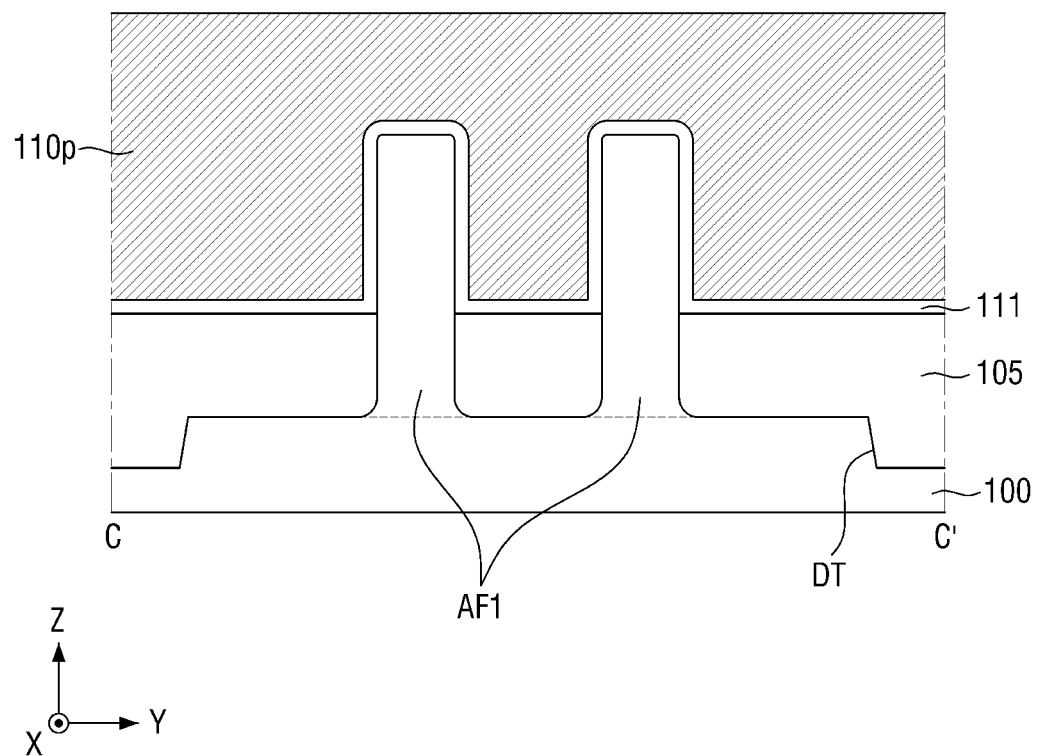
FIGS. 17 to 21 are intermediate stage diagrams for explaining a method for fabricating a semiconductor device according to exemplary embodiment of the inventive concept.

Referring to FIGS. 4 and 17, after the first active pattern AF1, the field insulating film 105 and the first gate insulating film 111 are formed on the substrate 100, a pre-gate electrode film 111p may be formed on the first gate insulating film 111.

Figure 18:
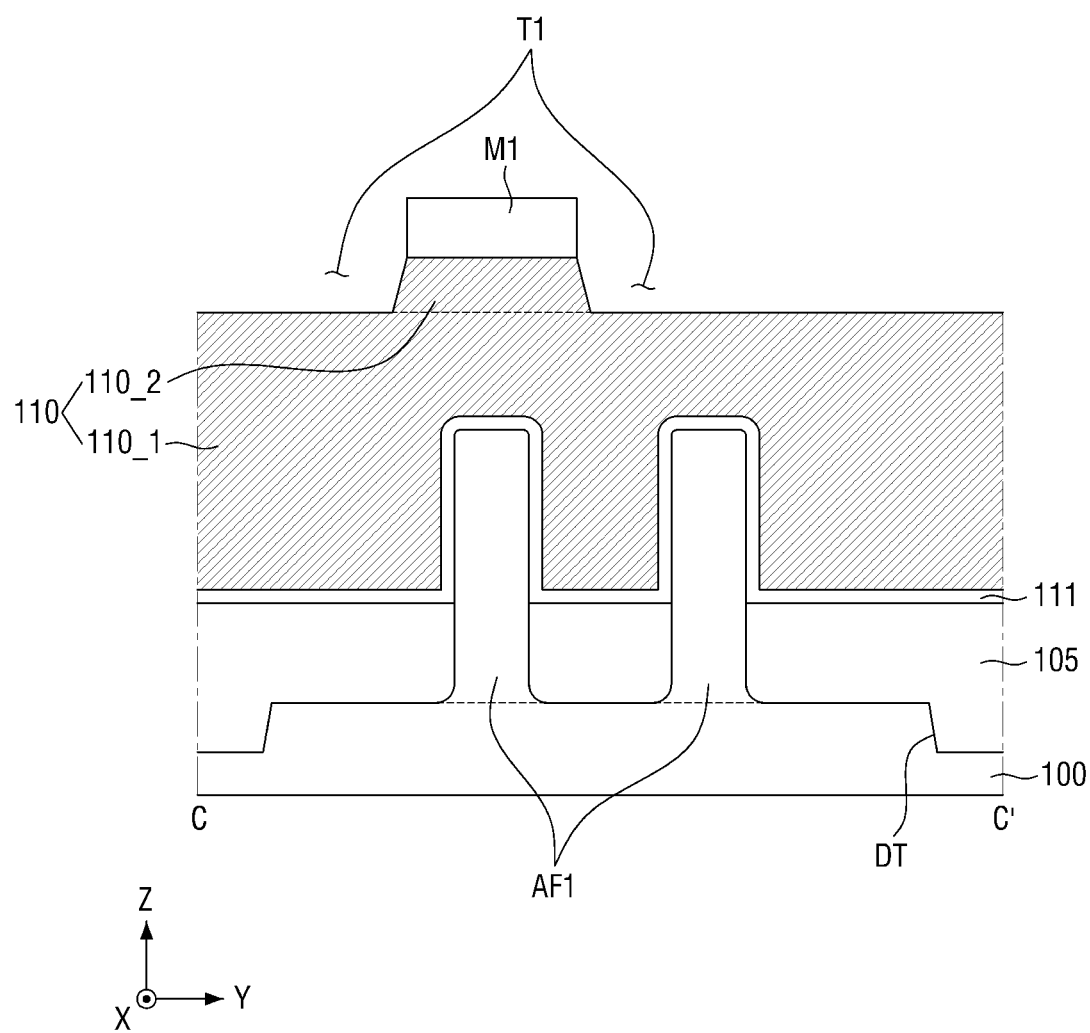

Referring to FIG. 18, a first mask pattern M1 may be formed on the pre-gate electrode film 111p.

Thereafter, a first recess T1 may be formed, by etching the pre-gate electrode film 111p using the first mask pattern M1 as a mask. Through an etching process using the first mask pattern M1, the first gate electrode 110 including the first portion 110_1 and the second portion 110_2 vertically protruding from the first portion 110_1 in the Z direction may be formed. The second portion 110_2 of the first gate electrode 110 may be formed on the first active region (RX1 of FIG. 1).

Figure 19:
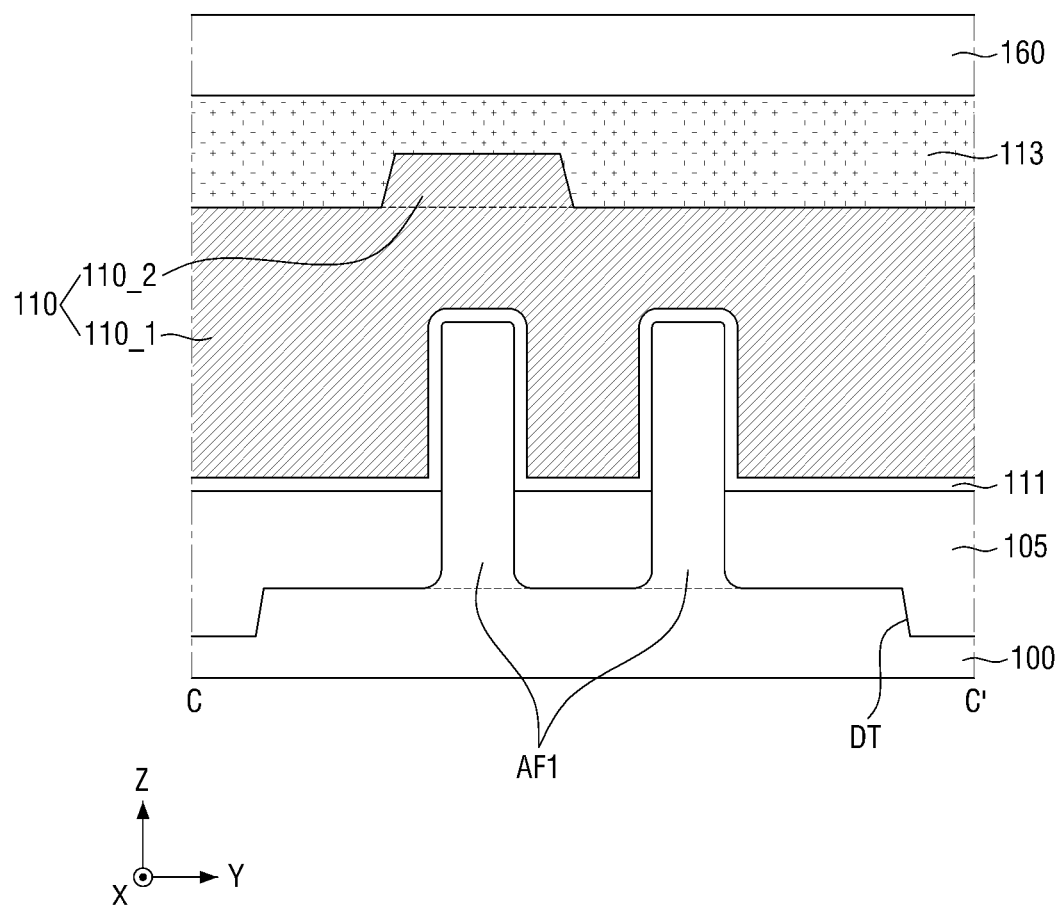

Referring to FIG. 19, a first capping pattern 113 may be formed on the first gate electrode 110. The first capping pattern 113 may be formed both on the first portion 110_1 of the first gate electrode 110 and on the second portion 110_2 of the first gate electrode 110. Subsequently, a first interlayer insulating film 160 may be formed on the first capping pattern 113.

Figure 20:
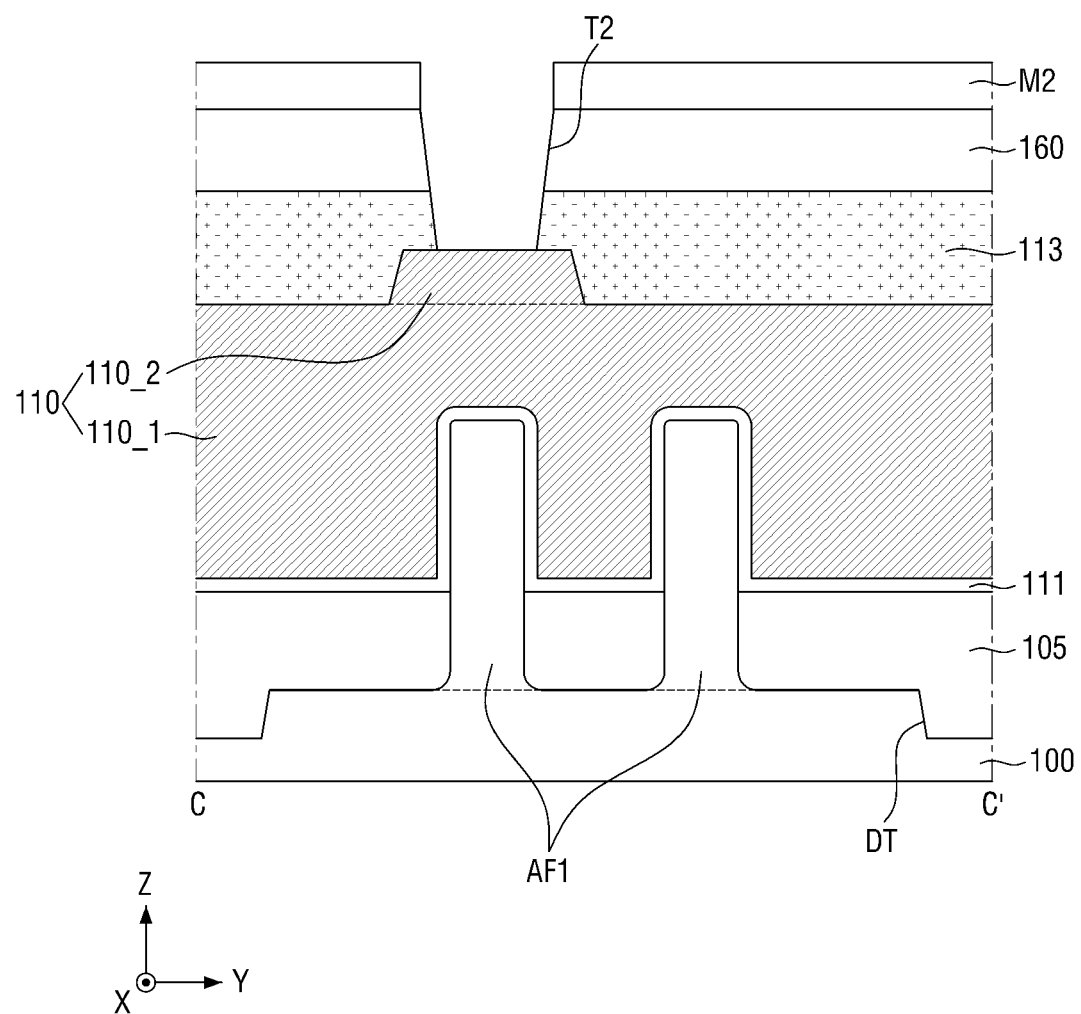

Referring to FIG. 20, a second mask pattern M2 may be formed on the first interlayer insulating film 160.

Subsequently, a second recess T2 may be formed, by etching the first interlayer insulating film 160 and the first capping pattern 113 using the second mask pattern M2 as a mask. The second recess T2 may be formed to overlay the second portion 110_2 of the first gate electrode 110 in the Z direction. The upper surface of the second portion 110_2 of the first gate electrode 110 may be exposed through the second recess T2.

Figure 21:
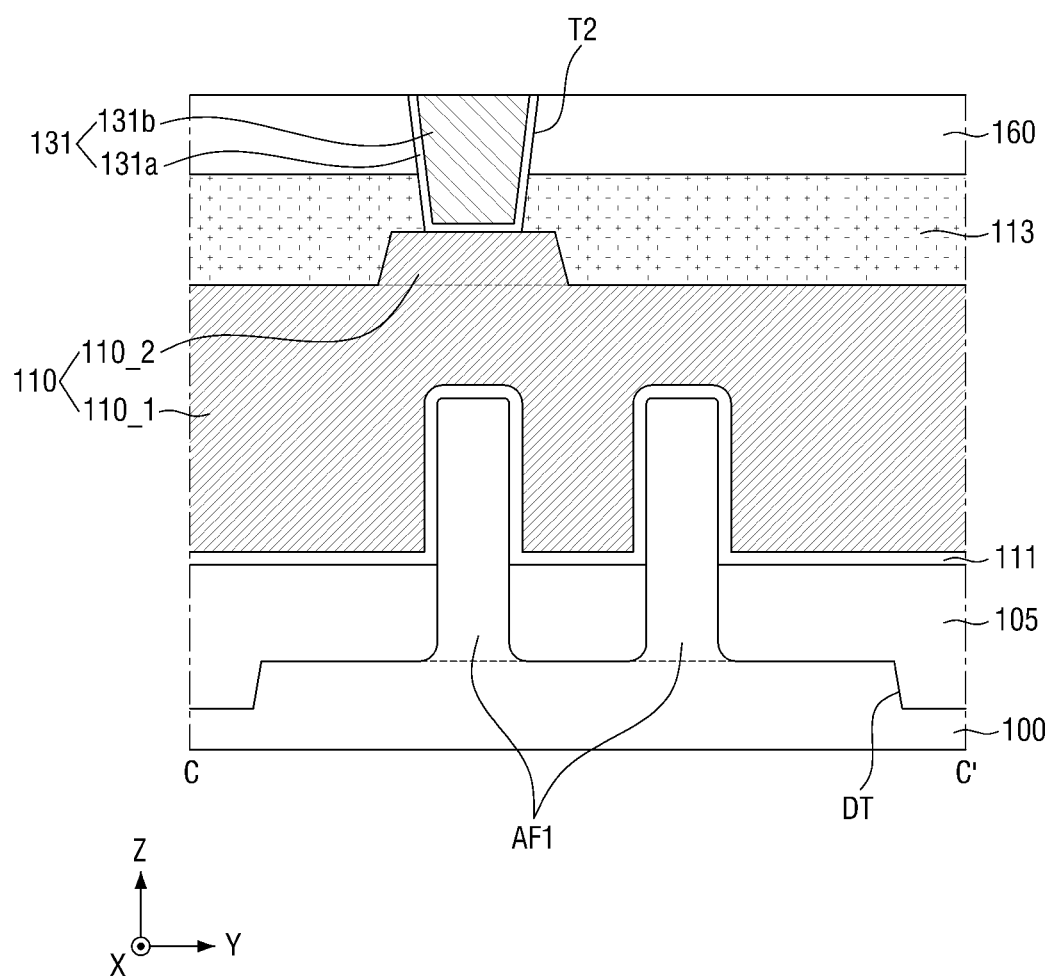

Referring to FIG. 21, a first gate contact 131 may be formed inside the second recess T2. The first gate contact 131 may be formed to overlay the second portion 110_2 of the first gate electrode 110 in the Z direction.

Subsequently, an etching stop film 161 and a second interlayer insulating film 170 may be formed on the first interlayer insulating film 160 and the first gate contact 131. Subsequently, a first via 181 is formed on the first gate contact 131 to penetrate the etching stop film 161 and the second interlayer insulating film 170, and the semiconductor device shown in FIG. 4 may be fabricated.

Those skilled in the art will appreciate that many variations and modifications may be made to the illustrated embodiments without substantially departing from the scope of the inventive concept.

What is claimed is:

1. A semiconductor device comprising:
an active pattern extending in a first horizontal direction on a substrate;
a gate electrode extends in a second horizontal direction across the active pattern, and includes a first portion, and a second portion protruding upward from the first portion in a vertical direction;
a capping pattern extending in the second horizontal direction on the gate electrode;
a gate contact disposed on the second portion, overlaying the active pattern, and penetrating the capping pattern to connect to the gate electrode;
a source/drain region disposed on at least one side of the gate electrode; and
a source/drain contact including a first portion connected to the source/drain region and extending in the second horizontal direction, and a second portion protruding upward from the first portion in the vertical direction, wherein
an upper surface of the first portion of the source/drain contact is formed between an upper surface of the first portion of the gate electrode and an upper surface of the second portion of the gate electrode.

2. The semiconductor device of claim 1, wherein a lower surface of the capping pattern is formed with an upward-facing concave shape.

3. The semiconductor device of claim 1, wherein a lower surface of the capping pattern is formed with a downward-facing convex shape.

4. The semiconductor device of claim 1, further comprising a gate spacer extending in the second horizontal direction along both side walls of the gate electrode, wherein an upper surface of the gate spacer contacts the capping pattern.

5. The semiconductor device of claim 1, further comprising an interlayer insulating film disposed to cover a side wall of the capping pattern.

6. The semiconductor device of claim 5, wherein the side wall of the capping pattern directly contacts the interlayer insulating film.

7. A semiconductor device comprising:
an active pattern extending in a first horizontal direction on a substrate;
a gate electrode extending in a second horizontal direction across the active pattern, and including a first portion, and a second portion protruding upward from the first portion in a vertical direction;
a capping pattern extending in the second horizontal direction on the gate electrode;
a source/drain region disposed on at least one side of the gate electrode;
a gate contact penetrating through the capping pattern to connect the gate electrode; and
a source/drain contact including a first portion connected to the source/drain region and extending in the second horizontal direction, and a second portion protruding upward from the first portion in the vertical direction, wherein
an upper surface of the first portion of the source/drain contact being formed to be lower than an upper surface of the first portion of the gate electrode.

8. The semiconductor device of claim 7, wherein the gate contact overlays the active pattern.

9. The semiconductor device of claim 7, wherein at least part of the source/drain contact contacts the capping pattern.

10. The semiconductor device of claim 7, wherein a height between the upper surface of the first portion of the source/drain contact and the upper surface of the first portion of the gate electrode is in a range of between 2 nm to 12 nm.

11. The semiconductor device of claim 7, wherein a height between the upper surface of the first portion of the gate electrode and an upper surface of the second portion of the gate electrode is in a range of between 3 nm to 10 nm.

12. The semiconductor device of claim 7, further comprising:
a first via extending in the vertical direction and directly connecting the gate electrode; and
a second via extending in the vertical direction to directly connect the second portion of the source/drain contact.

13. A semiconductor device comprising:
a plurality of nanowires sequentially stacked on a substrate, wherein each nanowire in the plurality of nanowires extends in a first horizontal direction;
a gate electrode surrounding the plurality of nanowires, extending in a second horizontal direction, and including a first portion, and a second portion protruding upward from the first portion in a vertical direction;
a capping pattern extending in the second horizontal direction on the gate electrode; and
a gate contact disposed on the second portion of the gate electrode, overlaying the plurality of nanowires, and penetrating the capping pattern to connect to the gate electrode.

14. The semiconductor device of claim 13, further comprising:
a source/drain region disposed on at least one side of the plurality of nanowires; and
a source/drain contact connected to the source/drain region, and including a first portion extending in the second horizontal direction, and a second portion protruding upward from the first portion in the vertical direction, wherein
an upper surface of the first portion of the source/drain contact is formed on a plane different from an upper surface of the first portion of the gate electrode.

15. The semiconductor device of claim 14, wherein the upper surface of the first portion of the source/drain contact is formed to be lower than the upper surface of the first portion of the gate electrode.

16. The semiconductor device of claim 13, further comprising an interlayer insulating film disposed on a side wall of the capping pattern contacting the side wall of the capping pattern.

* * * * *